(12) United States Patent
Hijioka et al.

(10) Patent No.: US 9,042,117 B2
(45) Date of Patent: May 26, 2015

(54) SEMICONDUCTOR DEVICE

(75) Inventors: Kenichiro Hijioka, Kanagawa (JP); Akira Tanabe, Kanagawa (JP); Yoshihiro Hayashi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 856 days.

(21) Appl. No.: 13/064,036

(22) Filed: Mar. 2, 2011

(65) Prior Publication Data
US 2011/0235302 A1 Sep. 29, 2011

(30) Foreign Application Priority Data
Mar. 24, 2010 (JP) ................... 2010-067383

(51) Int. Cl.
 H05K 1/11 (2006.01)
 H05K 1/14 (2006.01)
 H01L 23/522 (2006.01)
(52) U.S. Cl.
 CPC ........ H01L 23/5227 (2013.01); H01L 23/5225 (2013.01); *H01L 2924/0002* (2013.01)
(58) Field of Classification Search
 USPC ............... 361/761–775, 782–784, 794–795; 257/679–685, 723–732; 174/259–262; 336/199–200
 See application file for complete search history.

(56) References Cited

U.S. PATENT DOCUMENTS

| | | | |
|---|---|---|---|
| 5,801,521 A * | 9/1998 | Mizoguchi et al. ........... 323/282 |
| 6,380,567 B1 | 4/2002 | Okitaka | |
| 6,456,172 B1 * | 9/2002 | Ishizaki et al. ................ 333/133 |
| 6,483,714 B1 * | 11/2002 | Kabumoto et al. ........... 361/760 |
| 6,809,419 B2 | 10/2004 | Minami et al. | |
| 6,963,034 B2 * | 11/2005 | Iwanami ........................ 174/260 |
| 7,002,233 B2 | 2/2006 | Butaye et al. | |
| 7,193,263 B2 | 3/2007 | Barth | |
| 7,199,472 B2 | 4/2007 | Minami et al. | |
| 7,283,032 B2 * | 10/2007 | Inoue et al. ...................... 338/21 |
| 7,750,413 B2 | 7/2010 | Hayashi et al. | |
| 2002/0075116 A1 * | 6/2002 | Peels et al. ..................... 336/200 |
| 2002/0089798 A1 * | 7/2002 | Iwanami ......................... 361/32 |

(Continued)

FOREIGN PATENT DOCUMENTS

| JP | 60-136156 | 9/1985 |
|---|---|---|
| JP | 6-13590 A | 1/1994 |

(Continued)

OTHER PUBLICATIONS

Notification of Reasons for Refusal dated Nov. 19, 2013, with English translation.

*Primary Examiner* — Tuan T Dinh
(74) *Attorney, Agent, or Firm* — McGinn IP Law Group, PLLC

(57) ABSTRACT

A semiconductor device effectively suppress the problem of mutual interaction occurring between an inductor element and wires positioned above the inductor element formed over the same chip. A semiconductor device includes a semiconductor substrate and a multi-wiring layer formed overlying that semiconductor substrate, and in which the multi-wiring layer includes: the inductor element and three successive wires and a fourth wire formed above the inductor element; and two shielded conductors at a fixed voltage potential and covering the inductor element as seen from a flat view, and formed between the inductor element and three successive wires and a fourth wire formed above the inductor element.

23 Claims, 22 Drawing Sheets

(56) References Cited

U.S. PATENT DOCUMENTS

| | | |
|---|---|---|
| 2002/0158306 A1 | 10/2002 | Niitsu |
| 2003/0127704 A1* | 7/2003 | Kobayashi et al. ........... 257/531 |
| 2003/0214378 A1 | 11/2003 | Tung et al. |
| 2006/0038257 A1 | 2/2006 | Anzai |
| 2009/0212402 A1 | 8/2009 | Nakashiba |
| 2009/0315662 A1 | 12/2009 | Hijioka et al. |

FOREIGN PATENT DOCUMENTS

| | | |
|---|---|---|
| JP | 11-220030 | 8/1999 |
| JP | 2002-093916 | 3/2002 |
| JP | 2002-198490 | 7/2002 |
| JP | 2002-198490 A | 7/2002 |
| JP | 2003-68862 A | 3/2003 |
| JP | 2004-031922 | 1/2004 |
| JP | 2004-111796 A | 4/2004 |
| JP | 2006-504274 A | 2/2006 |
| JP | 2006-59959 A | 3/2006 |
| JP | 2008-091631 | 4/2008 |
| JP | 2008-218566 | 9/2008 |
| JP | 2009-194302 A | 8/2009 |
| WO | WO 2004/112138 | 12/2004 |
| WO | WO 2008/016089 | 2/2008 |

* cited by examiner

MAGNETIC FLUX

SEMICONDUCTOR DEVICE

CROSS-REFERENCE TO RELATED APPLICATIONS

The disclosure of Japanese Patent Application No. 2010-67383 filed on Mar. 24, 2010 including the specifications, drawings and abstract is incorporated herein by reference in its entirety.

BACKGROUND

1. Field of the Invention

The present invention relates to a semiconductor device and to a manufacturing method for a semiconductor device.

2. Description of Related Art

Increased performance of semiconductor devices in recent years has resulted in practical semiconductor devices operating at high frequencies exceeding the gigahertz level. This improved performance is mostly due to greater miniaturization of circuit elements mainly achieved by tinier gate lengths and suppressing short channel effects to reach higher operating frequencies. In semiconductor devices using signals in the high frequency bands at the gigahertz level or higher, inductor elements must often be highly integrated onto the semiconductor substrate to achieve a broad bandwidth and boost the gain of amplifiers that utilize impedance matching and resonance phenomenon.

Inductor elements function as electronic components by accumulating the magnetic energy in the vicinity of the inductor element. When inductor elements are mounted overlying a semiconductor substrate, eddy current loss due to magnetic fields penetrating to the semiconductor substrate positioned below the inductor element, and wiring near the inductor element cause poor inductor element performance.

Inductor elements used in wireless circuits must have a high Q value (resistance to oscillation i.e. low resistance) in order to achieve low-noise characteristics needed in wireless applications, so a shielded conductor containing slits is formed overlying the semiconductor substrate at a position below the inductor element in order to reduce losses caused by the semiconductor substrate (Japanese Patent Application Publication Nos. 2004-031922 and 2002-093916, and C. P. Yue et al. "On-Chip Spiral Inductors with Patterned Ground Shields for Si-Based RF IC's", IEEE Journal of Solid-State Circuits, 1998, Vol. 33, No. 5, 743). There is even magnetic field leakage from the upper section of the inductor element, and inductor elements for radio use utilize wiring with thick film formed in the uppermost layer in order to boost the Q value. Generally, no wiring is formed in the section above the inductor elements so depending on the structure, the problem of magnetic field leakage in the section above the inductor elements can be avoided in communication circuits.

On the other hand, along with the higher operating frequencies in semiconductor devices, increasingly large numbers of inductor elements are being used in logic circuits in recent years. The inductor elements used in logic circuits are typically called, "Peaking inductors." These peaking inductors are mainly used as amplifier loads and so differ from inductor elements utilized in wireless circuits because a comparatively low Q value is allowed. These peaking inductors on the other hand are mounted in large numbers within the chip and so the inductor elements must occupy a minimal surface area. To ensure that inductor elements take up minimal surface area, technology was proposed for inductor elements having a multilayer structure using wires positioned in the lower layers (International Patent Application No. WO2008/016089).

One method in the related art for lowering magnetic flux leakage to the upper section of the inductor element when a semiconductor device containing an inductor element is mounted over a printed circuit board is shown in FIG. 20. Here, an electromagnetic shielded conductor is formed above the inductor element using a pad wiring layer overlying the inductor element in order to block out mutual interaction from occurring between the inductor element and the wiring in the mounting board (Japanese Patent Application Publication No. 2008-218566).

Moreover, technology was disclosed in Japanese Patent Application Publication No. 2002-198490 for reducing degradation in inductor element characteristics due to the electromagnetic shielded conductor as shown in FIG. 21, by forming an electromagnetic shielded conductor in the lower section and the upper section of the inductor element and then forming an opening in the magnetic flux pass region generated in the center section of the inductor element in the electromagnetic shielded conductor.

International Patent Application No. WO2004/112138, Japanese Patent Application Publication No. 2008-091631, and Japanese Patent Application Publication No. Hei11 (1999)-220030 disclose a technology utilizing magnetic material as the electromagnetic shielded conductor.

SUMMARY

Though the above described technology has produced peaking inductors that take up minimal surface area, these inductors are mounted in large numbers within the chip. The circuit design therefore positions the wiring above the inductor elements causing the problem of mutual interaction between the inductor element and the wiring.

Typically used semiconductor device design methods for example, form wiring at a fixed voltage potential such as at power supply voltage potential or ground voltage potential, by utilizing the uppermost layer wiring in the semiconductor device. In most cases the wiring is a structure of repetitive fixed wiring widths and fixed wiring spacing that is positioned above the inductor elements. A mutual interaction consequently occurs between the inductor elements and the wiring that causes poor inductor element characteristics due to losses in wires at a fixed voltage potential and leads to circuit malfunctions.

Methods employed to resolve these problems included techniques to position the wiring while avoiding the area above the inductor element. However this method not only led to a loss of freedom in wiring circuit design but also led to utilizing a greater area of the chip. Moreover, forming a pad overlying the inductor element for making external couplings was impossible and therefore also led to a large increase in the chip area of the semiconductor device.

Patent documents: Japanese Patent Application Publication Nos. 2004-031922, 2002-093916, 2008-218566, and 2002-198490, International Patent Application No. WO2004/112138, and Japanese Patent Application Publication Nos. 2008-091631 and Hei11(1999)-220030 as well as the non-patent document: C. P. Yue et al. "On-Chip Spiral Inductors with Patterned Ground Shields for Si-Based RF IC's", IEEE Journal of Solid-State Circuits, 1998, Vol. 33, No. 5, 743 do not disclose methods for effectively controlling the mutual interaction occurring between the inductor elements and the wiring positioned above the inductor elements over the same chip.

According to an aspect of the present invention, there is provided a semiconductor device which comprises a semiconductor substrate; and a multi-layer wiring layer formed overlying the semiconductor substrate; in which the multilayer wiring layer includes an inductor element, inductor overhead wires; and a shielded conductor having a fixed voltage potential and formed between the inductor element and the inductor overhead wires and that covers the inductor element as seen from a flat view.

According to another aspect of the present invention, there is provided a semiconductor device manufacturing method that includes forming an inductor element overlying a semiconductor substrate; forming a shielded conductor at a fixed voltage potential above the inductor element; and forming wiring above the shielded conductor.

The inventors perceived the fact that in semiconductor devices utilizing numerous inductor elements such as in high-speed logic circuits allowing a comparatively low Q value compared to wireless circuits, the effect that the wiring exerts in inductor elements can be suppressed by installing a shielded conductor at a fixed voltage potential between the inductor element and the wiring positioned above the inductor element in semiconductor devices containing inductor elements utilizing lower layer wiring layers.

The present invention can in other words achieve a semiconductor device that occupies a minimal area because the designer can freely install an external coupled pad or wiring at a fixed voltage potential above an inductor element utilized in high-speed logic circuits. The man-hours required for designing the semiconductor device containing the inductor element can also be reduced since there is greater design freedom by placement above the inductor element.

The present invention is therefore capable of effectively suppressing the mutual interaction that occurs between the inductor element and the wiring positioned above the inductor element in the same chip.

DETAILED DESCRIPTION OF THE PREFERRED EMBODIMENTS

Figure 1:
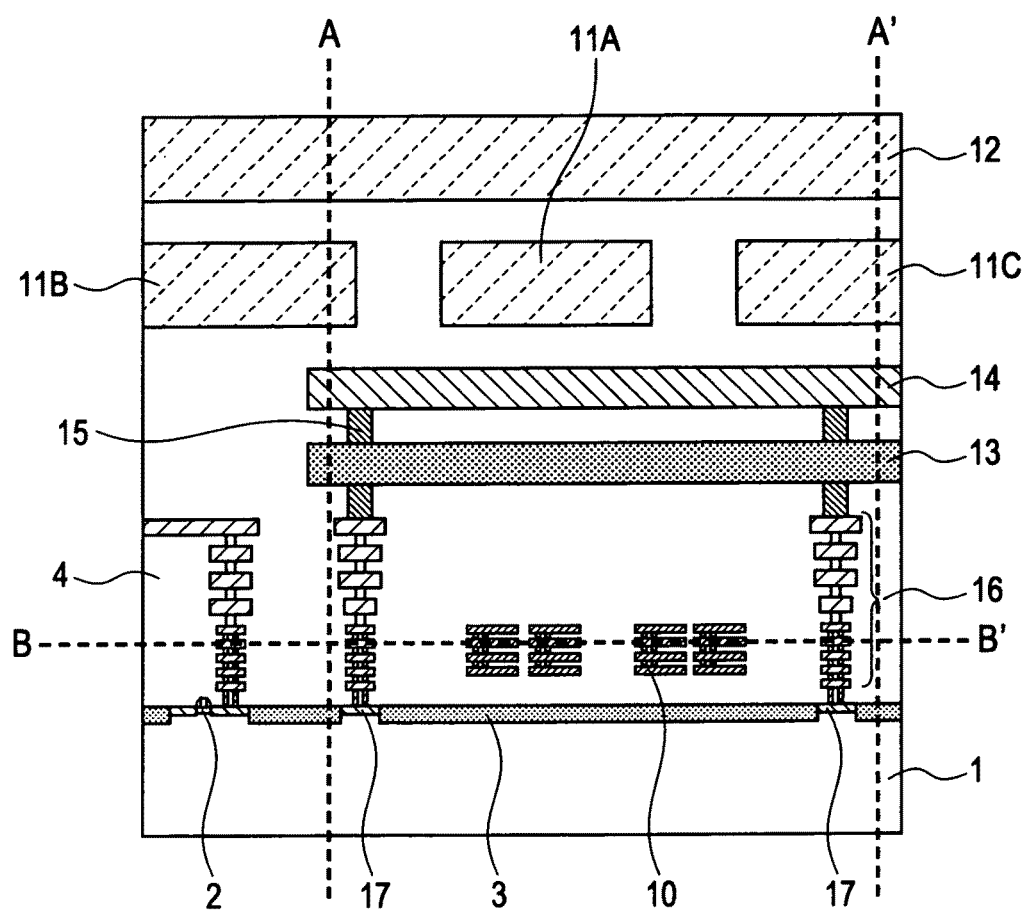
FIG. 1 is a cross sectional view showing a diagrammatic example of the layout of the semiconductor device of a first embodiment.

The embodiments of the present invention are next described in detail while referring to the drawings. The structural drawings all show diagrammatic views of the embodiments of this invention. Unless specifically stated otherwise, the structural dimensions of the present invention are not restricted by the percentage of structural elements in the drawings.

First Embodiment

FIG. 1 is a cross sectional view showing one diagrammatic example of the first embodiment. Examining FIG. 1 reveals that an active element 2, an element isolation region 3, and an interlayer dielectric film 4 are formed over a semiconductor substrate 1 the same as a typical semiconductor device; and multiple wiring layers are also formed within the interlayer dielectric film 4. The semiconductor device of the present embodiment in other words includes the semiconductor substrate 1, and multiple wiring layers (hereafter multi-wiring layers) formed over the semiconductor substrate 1. These multi-wiring layers contain an inductor element 10, the wires 11A through 11C, and the wires 12 formed above the inductor element 10, and the shielded conductors 13 and 14 at a fixed voltage potential and formed between the inductor element and the wires 11A through 11C and the wires 12 so as to cover the inductor element 10 as seen from a flat view. The "wires 11A through 11C" are sometimes hereafter simply referred to as "wire 11."

In methods generally utilized for manufacturing semiconductor devices, the interlayer dielectric film 4 is often comprised of multiple insulation films possessing many mutually different properties and constituents. However the characteristics and effects from the structure of the present embodiment are subject to no particular restrictions with regard to the structure and properties of the interlayer dielectric film 4 and therefore the notations for the interlayer dielectric film 4 are simplified in the drawings of this embodiment and are shown in the drawings as a single layer insulating (dielectric) film. The metal for forming the plurality of multi-layer wiring in the interlayer dielectric film 4 likewise is often made from metal such as aluminum or copper, or a metal compound utilizing aluminum or copper as the main element. However, the characteristics and effects from the structure of the present embodiment are subject to no particular restrictions with regard to the material of this multi-layer wiring. The structure of the wiring typically used in semiconductor devices is further often formed from metal such as titanium, tantalum, or ruthenium, or a metal compound containing those metals having a layer thickness thinner than metal wire and called a "barrier metal" on the side surface and bottom surfaces of the via (via hole) that join the metal wire and metal wiring. However, the characteristics and effects from the structure of the present embodiment are subject to no particular restrictions with regard to the composition of this metal wire and barrier metal so that the metal wire comprising the semiconductor device is shown in the drawings as a single metal wire. These preconditions are the same for all the embodiments.

Among the multiple wiring layers formed within the interlayer dielectric film 4 in this embodiment, the inductor element 10 is formed from the wiring layer near the semiconductor device 1. Unlike inductor elements used in voltage controlled oscillators (VCO) in wireless circuits, the inductor element 10 does not need a high Q value and may for example be an inductor element allowed a comparatively low Q value such as in peaking inductor elements also serving as resistive loads in high-speed logic circuits. The inductor element 10 may therefore be a spiral type inductor element of multiple laminated layers such as shown in the Japanese Unexamined Utility Model Application Sho60(1985)-136156 with each of the multiple layers directly coupled by via holes, etc. The inductor element structure may be simple loop type wires directly coupled by via holes as shown in International Patent Application No. WO2008/016089 for reducing the parasitic capacitance from the inductor element. The unique feature of the semiconductor device of this embodiment as described later on is that there is a shielded conductor placed between an inductor element and a wire positioned above this inductor element. The structure of the inductor element itself is not limited to the configurations in the embodiments. The structure of the inductor element itself can therefore be freely designed as needed. The designer of the semiconductor device can freely design the inductor elements within a range that renders the features of the structure of the embodiment. An inductor element structure generally called a "spiral inductor" may therefore also be employed that typically utilizes a single wire layer.

In this embodiment a wire 11 and a wire 12 are formed above the inductor element 10 as shown in FIG. 1. The wires 11 and 12 may be wires at a fixed voltage potential or signal wires at a variable voltage potential. The voltage of the wire at a fixed voltage potential may be the semiconductor device supply voltage potential, or may be the semiconductor device ground voltage potential, or may even be a voltage that is approximately half the power supply voltage potential of the semiconductor device utilized to drive the memory circuit. The unique feature of the semiconductor device of this embodiment is that there is a shielded conductor between the inductor element and the wiring positioned above this inductor element. However the embodiments are not limited to a structure in which the wiring is positioned above the inductor element. FIG. 1 shows an example of wiring in which the wire 11 and wire 12 are wires at a fixed voltage potential.

In the method for designing typically utilized semiconductor devices the wiring at a fixed voltage potential is comprised using the wiring layer positioned in the uppermost layer or a wiring layer comparatively close to the uppermost layer among the multiple layers of wire layers in the semiconductor device. Moreover, the film thickness of the wire at a fixed voltage potential is mostly larger than the film thickness of wire contained in the inductor element 10 so that the wires 11 and 12 are also shown in that way in FIG. 1.

There may also be multiple wires (wires 11 and 12 in the figure) as shown in FIG. 1. If there are multiple wires at a fixed voltage potential then the wires at a power supply voltage potential and wires at a ground voltage potential may be arranged alternately versus each other. The wires 11B and 11C shown in the figure may for example be wires at the power supply voltage potential, and the wire 11A may be a wire at ground voltage potential.

Referring now to FIG. 1, the shielded conductors 13 and 14 in this embodiment are formed between the inductor element 10, and the wire 11 at positions in respectively different layers. The number of shielded conductors is not limited to two and may be a larger number, and may also be one. If there are multiple shielded conductors then these shielded conductors will all be installed at respectively different layers between the inductor element 10 and the wire 11. The description in the second embodiment describes the case where the number of shielded conductors in the embodiment is one.

These types of shielded conductors 13 and 14 are formed at positions covering the inductor element 10 as seen from a flat view. The shielded conductors 13 and 14 are electrically coupled to each other at one section by way of via holes 15. If there are multiple shielded conductors then the multiple shielded conductors are all electrically coupled to each other.

The perpendicular distance relative to semiconductor substrate 1 (Hereafter, the perpendicular distance relative to semiconductor substrate 1 is referred to simply as "distance") between the inductor element 10 and the shielded conductor 13 as shown in FIG. 1 is preferably larger than the distance between the inductor element 10 and the semiconductor 1 in order to suppress loss in the inductor element 10 caused by the shielded conductors 13 and 14. If there are multiple shielded conductors then the distance between the shielded conductor positioned in the lowest layer and the inductor element 10 is preferably larger than the distance between the inductor element 10 and the semiconductor 1 in order to suppress loss in the inductor element 10 due to the shielded conductors.

The shielded conductors 13 and 14 have a fixed voltage potential. The fixed voltage potential may be any among a power supply voltage potential, a ground voltage potential, and a voltage approximately half the power supply voltage potential. In the example shown in FIG. 1, the shielded conductors 13 and 14 are coupled to a diffusion layer 17 at ground voltage potential by the multi-layer wiring 16. The technique utilized to couple to the shielded conductors 13 and 14 to a fixed voltage potential is not limited to the above described technique.

Figure 2A:
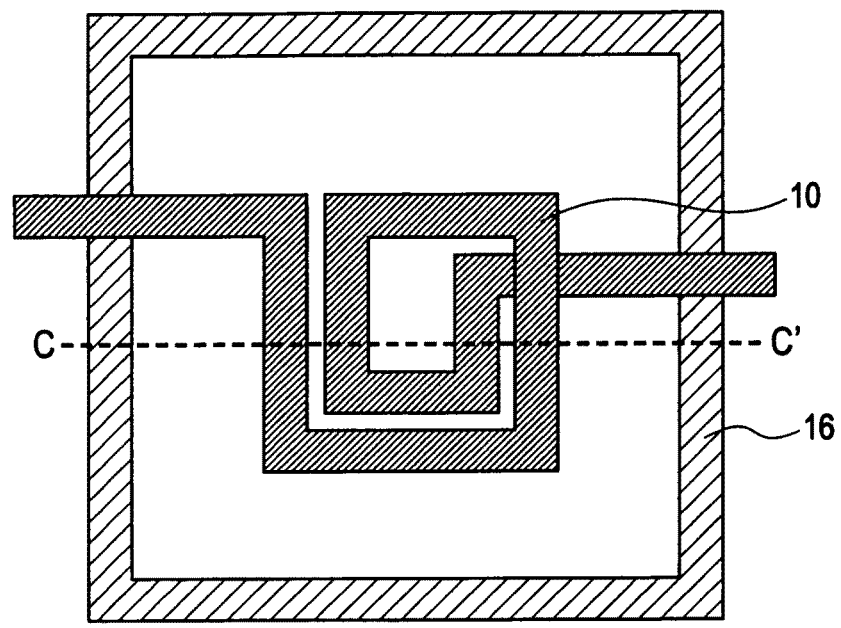
FIG. 2A is an upper view showing a diagrammatic example of the guard ring and inductor element of the present embodiment.
Figure 2B:
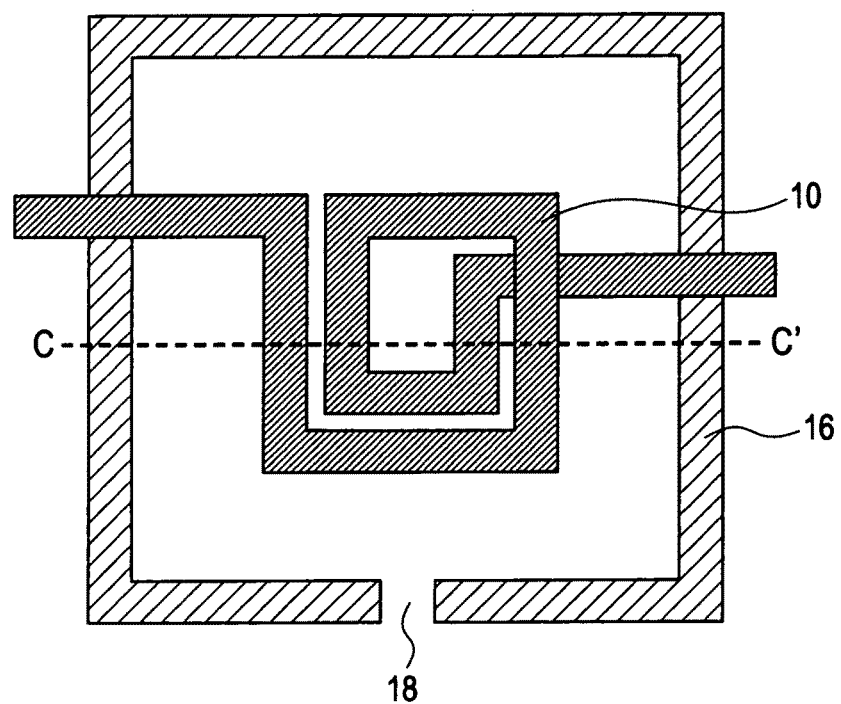
FIG. 2B is an upper view showing a diagrammatic example of the guard ring and inductor element of the present embodiment.

The multi-layer wiring 16 is wire in an approximate loop shape in the vicinity of the inductor element 10 and is generally called a "guard ring." The guard rings may have a structure in a circumferential shape so as to enclose the inductor element 10 as shown in FIG. 2A, or a structure containing a notch 18 in one section as shown in FIG. 2B and that does not completely loop around the inductor element circumference. FIGS. 2A and 2B are cross sectional views of the section B-B' for the region enclosed by the broken lines A and A' in FIG. 1. FIG. 1 is a cross sectional view of the section C-C' shown in FIG. 2A and FIG. 2B.

Figure 3:
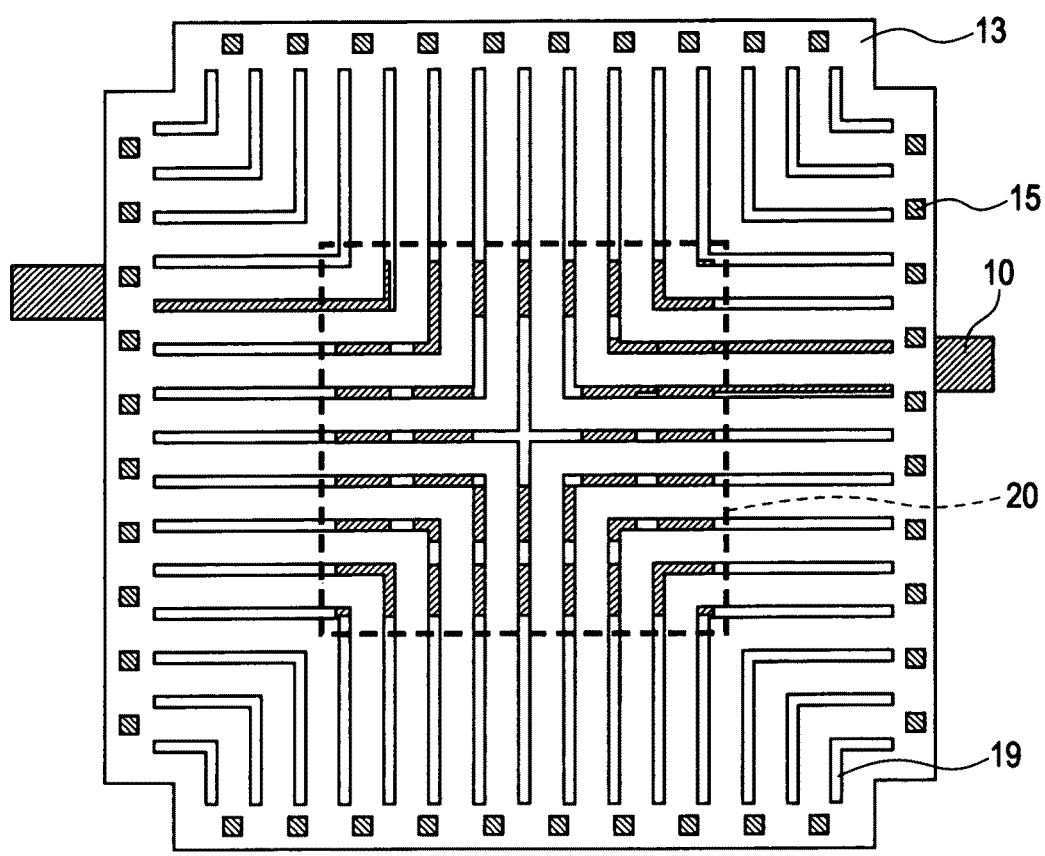
FIG. 3 is an upper view showing a diagrammatic example of the shielded conductor and inductor element of the present embodiment.

FIG. 3 shows an upper view giving an example of the relative positions of the inductor element 10 and the shielded conductor 13 shown in FIG. 1. This shielded conductor 13 as shown in FIG. 3 by containing the multiple slits 19, forms a pattern in which the multiple wires are electrically coupled to each other. In the region 20 where the inductor element 10 and the shielded conductor 13 overlap as seen from a flat view, the wires comprising the shielded conductor 13 form approximate right angles relative to the electrical current flow direction of the inductor element 10 directly below, or namely in the direction that the wiring comprising the inductor element 10 extends. This structure acts to suppress eddy current flow generated in the shielded conductor 13 and prevents poor performance in the inductor element 10.

Figure 4:
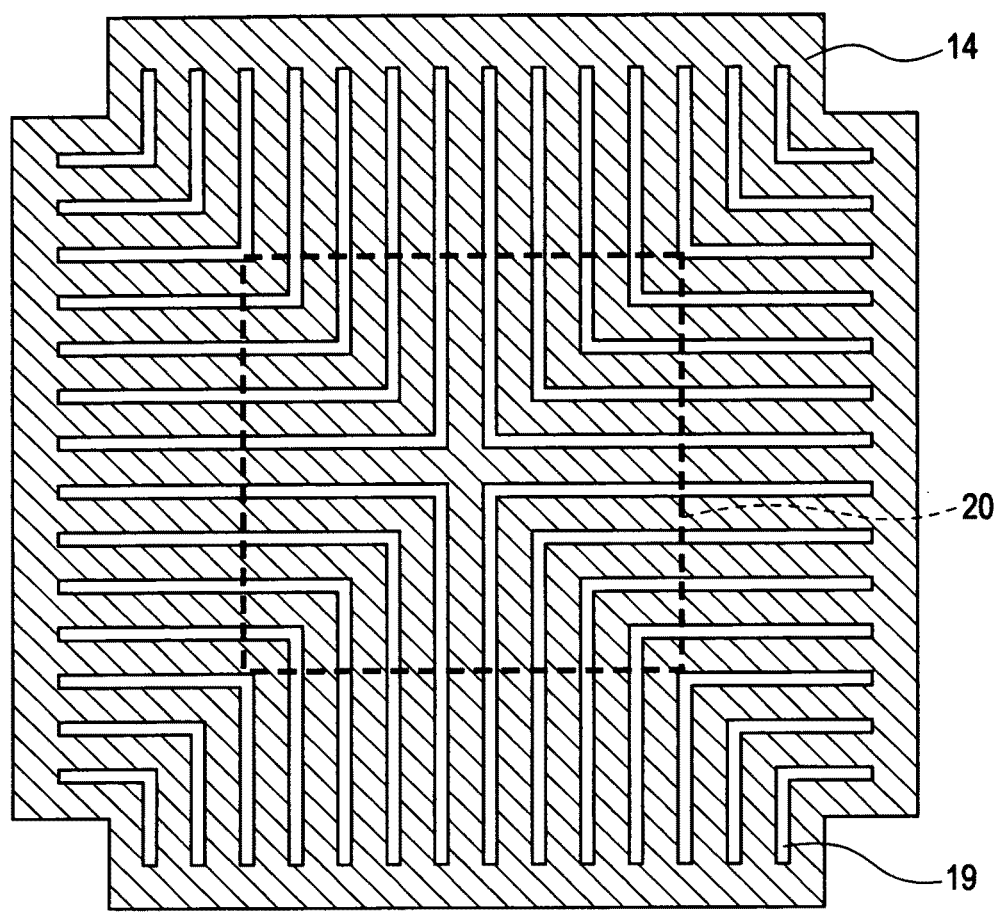
FIG. 4 is an upper view showing a diagrammatic example of the shielded conductor of the present embodiment.

FIG. 4 is an upper view showing one example of the shielded conductor 14 shown in FIG. 1. As shown in FIG. 4, the shielded conductor 14 forms a pattern in which multiple wires are electrically coupled to each other by forming slits 19 the same as for shielded conductor 13. In the region 20 where the inductor element 10 and the shielded conductor 14 overlap as seen from a flat view, the wires comprising the shielded conductor 14 form approximate right angles relative to the electrical current flow direction of the inductor element 10 directly below, or namely in the direction that wiring comprising the inductor element 10 extends. This structure acts to suppress eddy current flow generated in the shielded conductor 14 and prevents poor performance in the inductor element 10.

Figure 5:
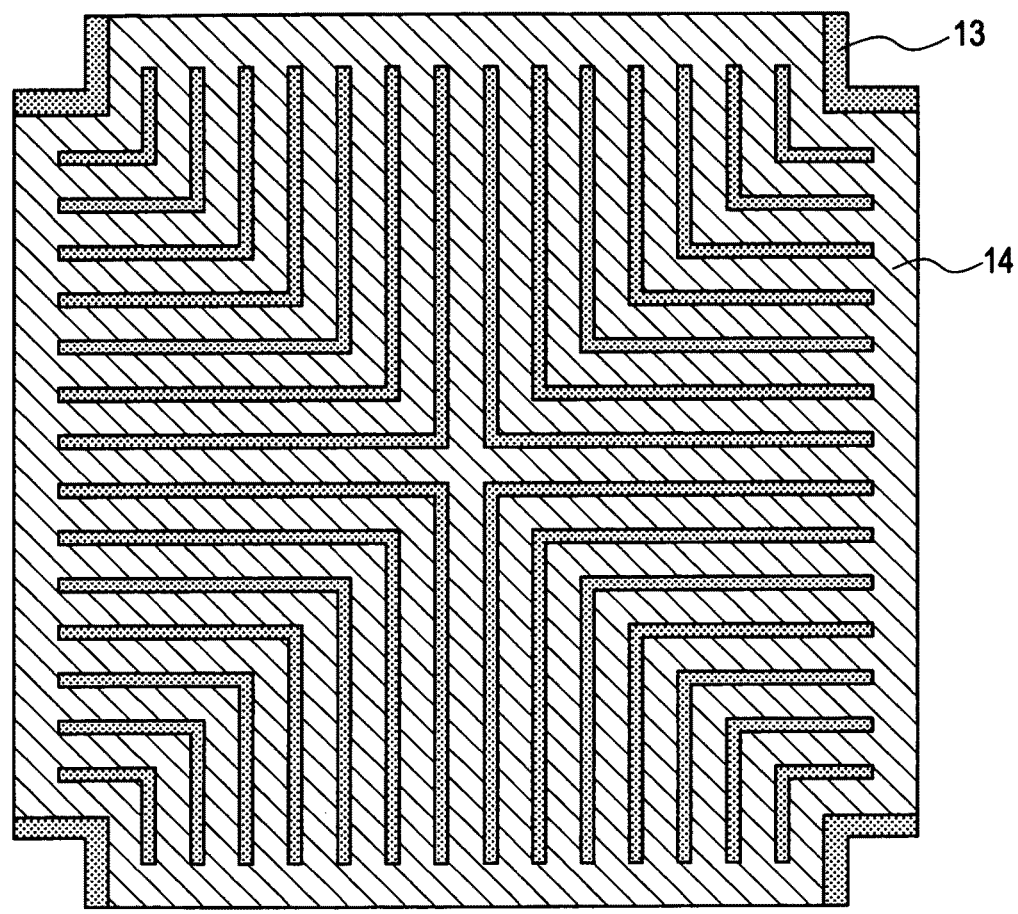
FIG. 5 is an upper view showing a diagrammatic example of the shielded conductor of the present embodiment.
Figure 6:
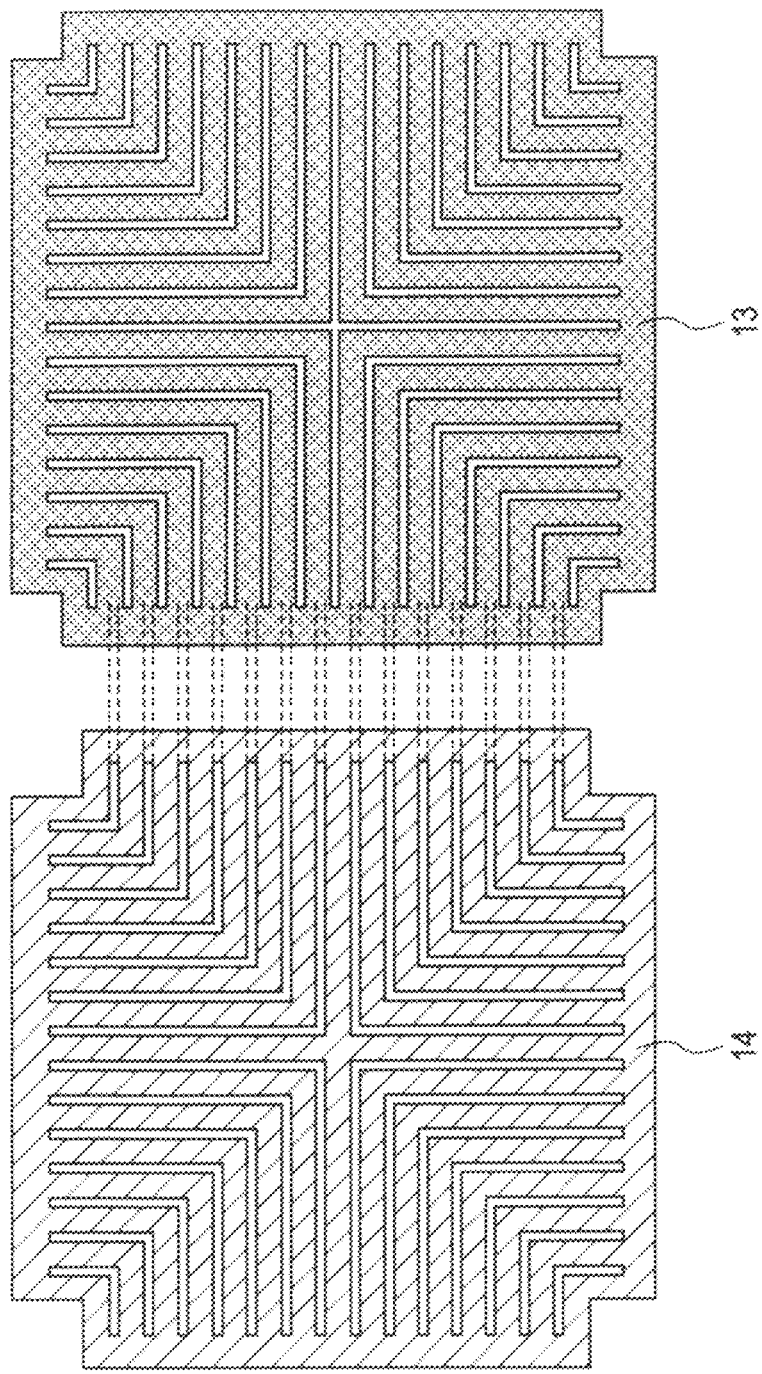
FIG. 6 is an upper view showing a diagrammatic example of the shielded conductor of the present embodiment.

FIG. 5 is an upper view showing the shielded conductors 13 and 14 respectively shown in FIG. 3 and FIG. 4 when overlapping each other as seen in FIG. 1. FIG. 6 shows the positional relations of the slits for the shielded conductors 13 and 14 respectively shown in FIG. 3 and FIG. 4.

As shown in FIG. 5, this embodiment is designed so that the wiring of one shielded conductor overlaps as seen from a flat view on a section equivalent to the slit in the other shielded conductor in the state shown in FIG. 1. The shielded conductor which is comprised of the shielded conductors 13 and 14 is therefore a structure containing no gap as seen from a flat view. This structure sufficiently shields the inductor element 10 from the wires 11 and 12 positioned above the shielded conductors 13 and 14. The width of the slits for the shielded conductors 13 and 14 can be made the same or slightly smaller than the wire width of shielded conductors 13 and 14 in order to render the structure. If there are multiple shielded conductors then all the shielded conductors can be formed in a pattern by providing slits the same as for the shielded conductors 13 and 14. If such a structure is utilized then every one of all the slit sections for the shielded conductors are comprised so as to overlap as seen from a flat view, at least one of the other wires for the shielded conductors.

Figure 7:
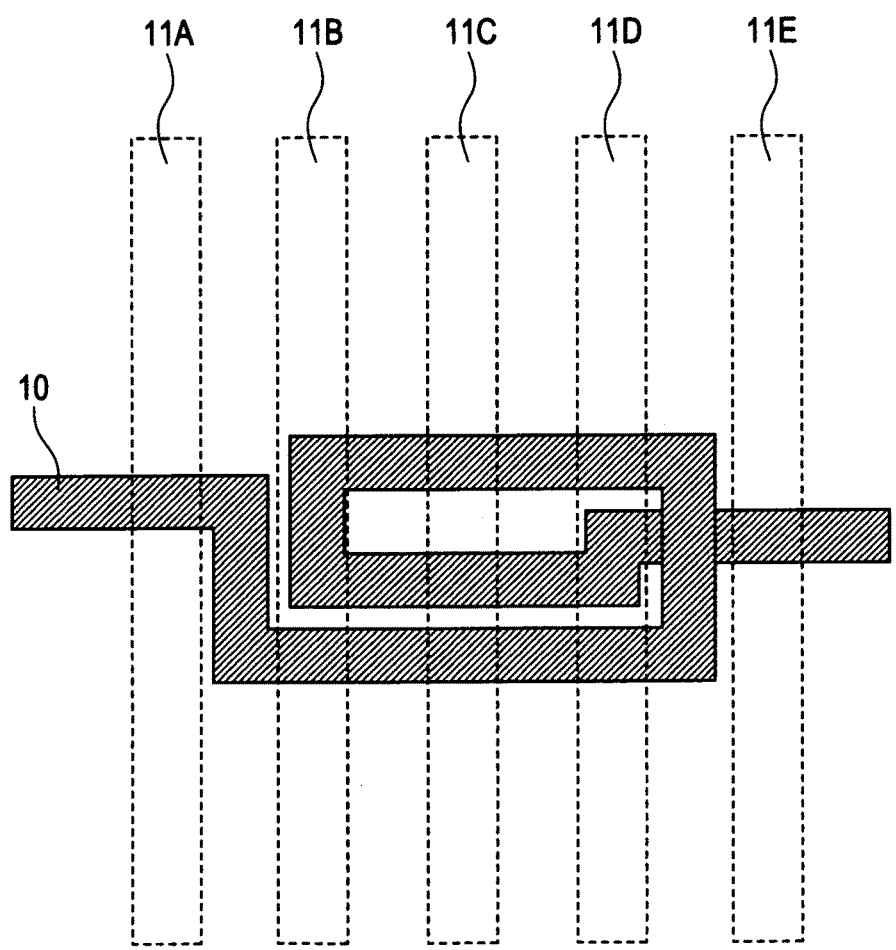
FIG. 7 is an upper view showing one diagrammatic example of the wiring and the inductor element of the present embodiment.

FIG. 7 shows an example of the relative positions of the inductor element 10, and the wire 11 as seen from a flat view.

In this embodiment, the wires 11A through 11E may all extend in the same direction as indicated in the figure. The inductor element 10 in this embodiment may be formed as indicated in the figure by consecutively linking the wire (first wire) extending approximately in parallel with the direction that the wires 11A through 11E extend; with a wire (second wire) extending at an approximate right angle to the direction that the wires 11A through 11E extend. Also in this embodiment, the total length of all the first wires may be made shorter than the total length of all the second wires as indicated in the drawing. A structure of this type suppresses the magnetic coupling between the inductor element 10 and the wire 11.

The film thickness of the wire 11 and the wire 12 in this embodiment may be made the same or thicker than the film thickness of the shielded conductors 13 and 14; and may be a film thickness the same or thicker than the inductor element 10. If there are multiple shielded conductors then the film thickness of the wire 11 and the wire 12 may be the same or thicker than the film thickness of all of the shielded conductors and may be the same or thicker than the film thickness of the inductor element 10.

Also in this embodiment, the film thickness of the shielded conductors 13 and 14 may be the same or thicker than the film thickness of the inductor element 10. If there are multiple shielded conductors then the film thickness of all the shielded conductors may be the same or thicker than the film thickness of the inductor element 10.

In this embodiment, the film thickness of the two shielded conductors that are adjacent to each other in the upward and downward directions are further formed to the same film thickness or so that the shielded conductor in the upper position has a larger film thickness.

Though not shown in the drawing, a metal pad for semiconductor device external coupling can be mounted even further above the wiring 12 at a fixed voltage potential. Namely, forming the shielded conductors 13 and 14 above the inductor element 10 in this embodiment suppresses characteristic fluctuations or performance deterioration in the inductor element 10 caused by the wires 11 and 12 above the shielded conductors 13 and 14. The semiconductor device designers can therefore freely position the external coupled pad or the wires above the shielded conductors 13 and 14 as needed.

The structure utilizes the shielded conductors 13 and 14 to render the effect of electrically and magnetically shielding the inductor element 10 from the wires 11 and 12 formed above the inductor element 10. The inductor element 10 can therefore provide stable performance as an inductor regardless of the wire 11 and 12 positions. This embodiment therefore requires no design to position the wires 11 and 12 above the inductor element 10. The area occupied by the semiconductor device can therefore be reduced, and the man-hours required for designing the semiconductor device also reduced.

The method for manufacturing the semiconductor device of the embodiment is described next.

The method for manufacturing the semiconductor device of the embodiment may utilize typical semiconductor device manufacturing methods, and the shielded conductors 13 and 14 above the inductor element 10, and the wires 11 and 12 may for example be formed utilizing a mask design for resist patterning that forms the wiring for the semiconductor device.

The manufacturing method for actually forming the semiconductor device may be a normally used semiconductor device manufacturing method that for example deposits a metallic film such as alumina across the entire surface of the insulating film formed overlying the semiconductor substrate, and after forming a wiring pattern by utilizing for example a photoresist overlying the metallic film, uses a method such as the reactive ion etching method to etch the metallic film of alumina to form the wiring pattern; or may deposit an insulating film overlying the semiconductor substrate, and after forming a wiring pattern by utilizing for example a photoresist overlying the insulating film, may then form a groove equivalent to the wiring within the insulating film by using a technique such as reactive ion etching, and embed metallic compounds of copper or with copper as the main element in the wiring groove and then utilize a wire forming method that is the so-called "damascene method" that forms the wiring by stripping away excess metal by a chemical machine polishing method, etc. The semiconductor device of the present embodiment can be formed by these methods after passing through a step for forming the inductor element 10 overlying the semiconductor substrate 1, a step for forming the shielded conductors 13 and 14 at a fixed voltage potential above the inductor element 10, and a step for forming wiring above the shielded conductors 13 and 14.

The method of the present embodiment for manufacturing semiconductor devices may in other words utilize a typical semiconductor device manufacturing method. If the manufacturing method is capable of forming semiconductor devices containing multiple wires over the semiconductor substrate, then a method other than the previously related typical semiconductor device manufacturing method may be utilized. So no detailed description of the manufacturing method is related in the following described other embodiments of the present invention.

The effect rendered by the semiconductor device of this embodiment is described next in detail utilizing the drawings.

In order to clarify the effect rendered by this embodiment, the inventors investigated how inductor element characteristics varied due to the wire 11 and 12 positions in each of the structures shown in FIG. 8A through FIG. 8D. The wires 11 and 12 are at ground voltage potential.

Figure 8A:
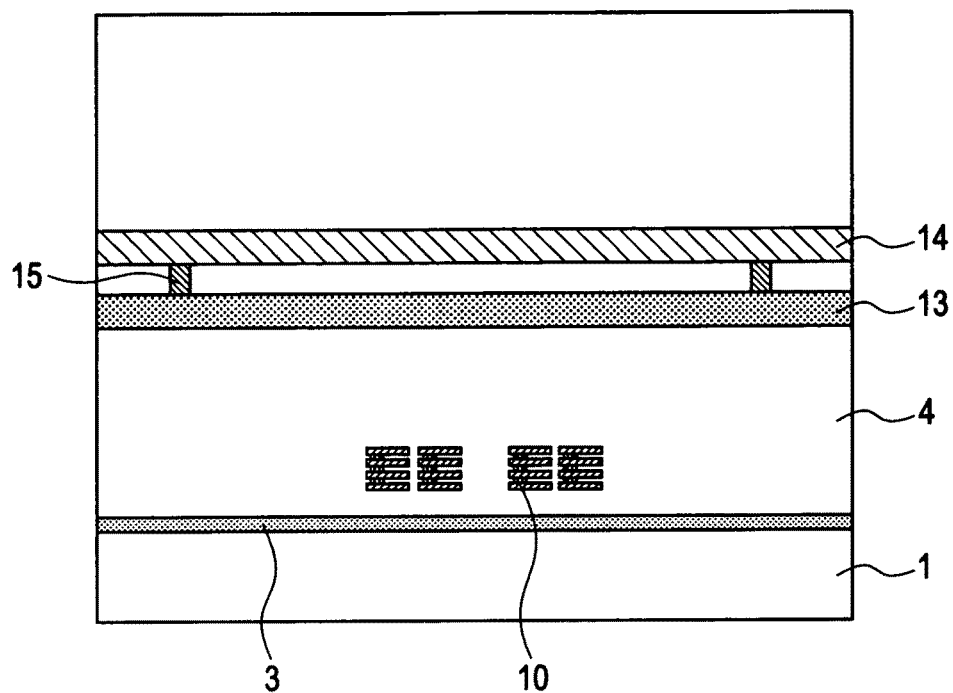
FIG. 8A is a cross sectional view showing one diagrammatic example of the semiconductor device.
Figure 8B:
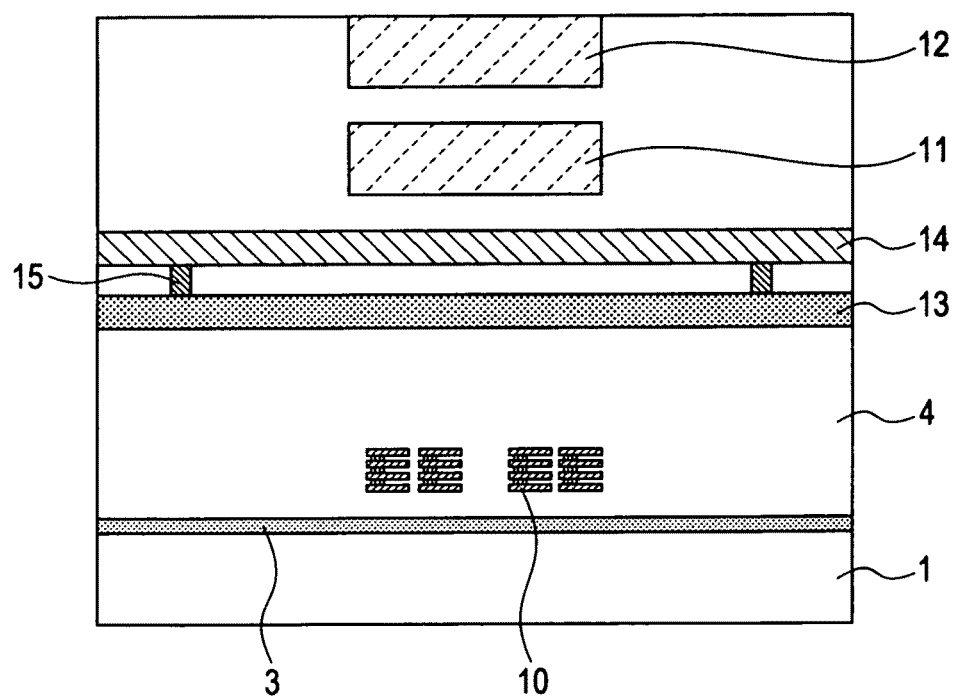
FIG. 8B is a cross sectional view showing one diagrammatic example of the semiconductor device of the first embodiment.
Figure 8C:
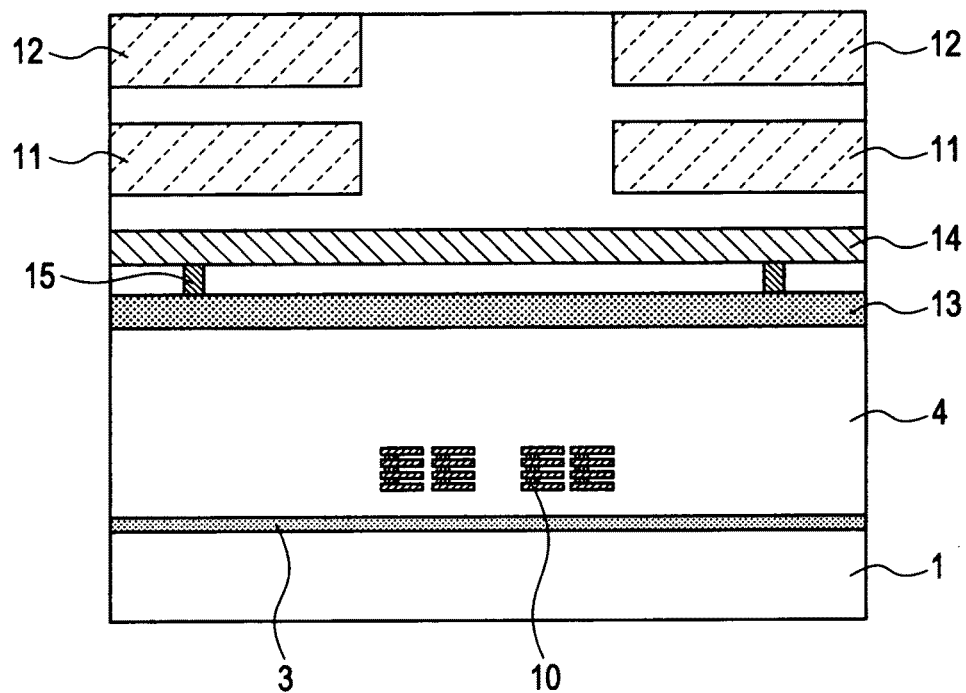
FIG. 8C is a cross sectional view showing one diagrammatic example of the semiconductor device of the first embodiment.
Figure 8D:
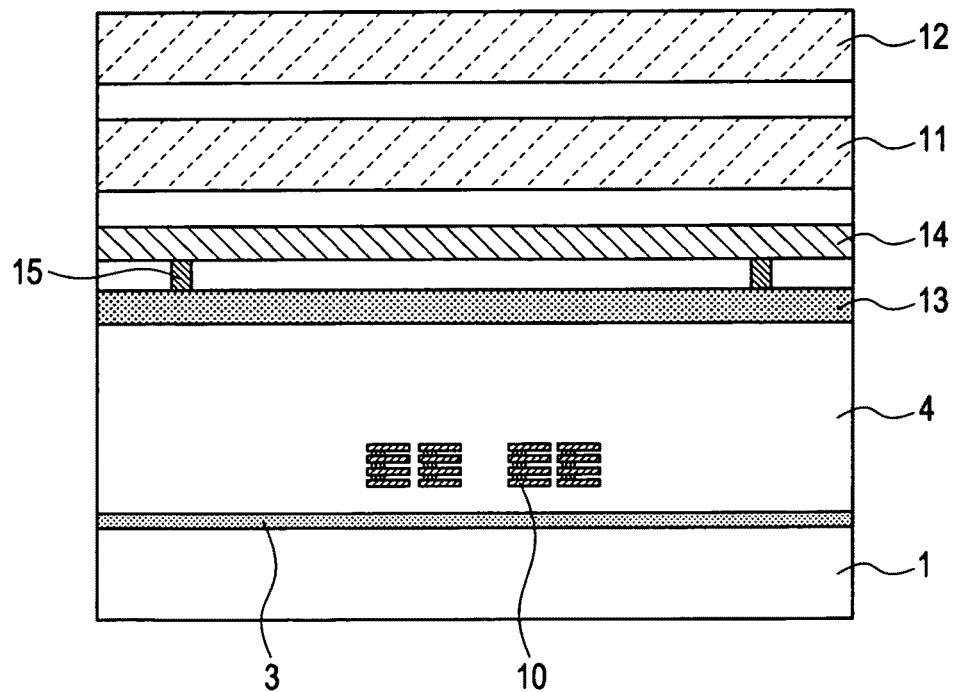
FIG. 8D is a cross sectional view showing one diagrammatic example of the semiconductor device of the first embodiment.

FIG. 8A is a drawing showing a structure of the embodiment containing the shielded conductors 13 and 14 but with no wire 11 and 12. FIG. 8B is a drawing showing a structure of the embodiment containing the shielded conductors 13 and 14 and further containing the wires 11 and 12 directly above the inductor element 10. FIG. 8C is a drawing showing a structure of the embodiment containing the shielded conductors 13 and 14 and further containing the wires 11 and 12 at positions that are not directly above the inductor element 10. FIG. 8D is a drawing showing a structure of the embodiment containing the shielded conductors 13 and 14 and further containing the wires 11 and 12 to fully cover the inductor element 10 as seen from a flat view.

Measurements were made of inductance frequency dependence in each of the structures shown in FIG. 8A through 8D. A guard ring as shown in FIG. 1 was installed though not shown in the drawings in FIG. 8A through 8D.

Figure 9:
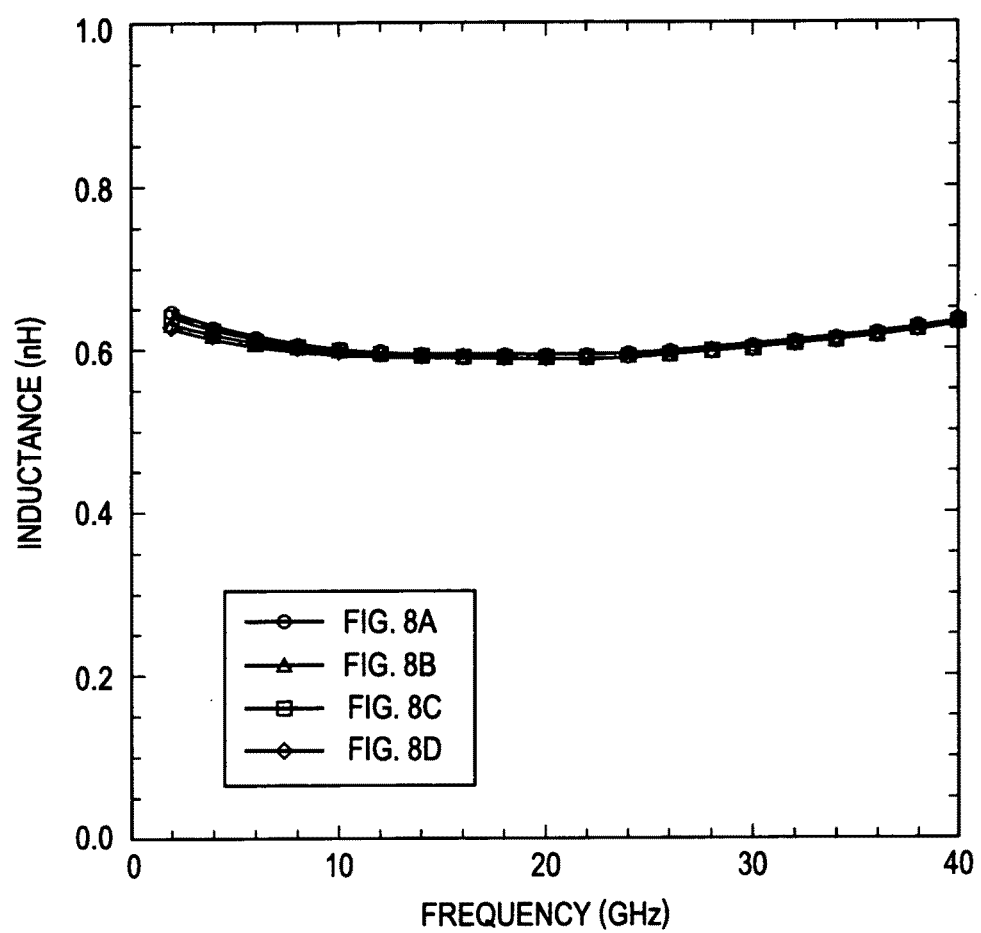
FIG. 9 is a drawing showing the frequency dependence of the structures in FIG. 8A through FIG. 8D on the inductance.

FIG. 9 shows inductance frequency dependence of inductor element 10 in each of the structures shown in FIG. 8A through 8D. As can be seen in FIG. 9, the fluctuation in inductance is extremely small in these structures.

Inductance values for each structure are next shown in Table 1 at 2 GHz and 20 GHz.

TABLE 1

|  | Inductance (nH) at 2 GHz | Inductance (nH) at 20 GHz |
| --- | --- | --- |
| FIG. 8A | 0.646 | 0.592 |
| FIG. 8B | 0.632 (−2.1%) | 0.592 (±0%) |

TABLE 1-continued

|  | Inductance (nH) at 2 GHz | Inductance (nH) at 20 GHz |
| --- | --- | --- |
| FIG. 8C | 0.642 (−0.7%) | 0.591 (−0.2%) |
| FIG. 8D | 0.628 (−2.7%) | 0.590 (−0.3%) |

The figures in the parentheses in Table 1 indicate in percent the increase or decrease in the inductance value of the structure shown in FIG. 8A. The decrease in inductance at 2 GHz as shown in Table 1 is a maximum for the structure shown in FIG. 8D, however that is only a small value of 2.7 percent. Moreover there is virtually no change in inductance at 20 GHz.

As shown by these results, positioning the shielded conductors 13 and 14 above the inductor element 10 in this embodiment, obtain nearly fixed inductance performance regardless of the positions of the wires 11 and 12.

A test identical test to that above was made as a comparative example in which the shielded conductors 13 and 14 were removed from the structures shown in FIG. 8A through 8C. In other words, a test identical to that shown above was made on the structures shown in FIG. 10A through 10C.

Figure 10A:
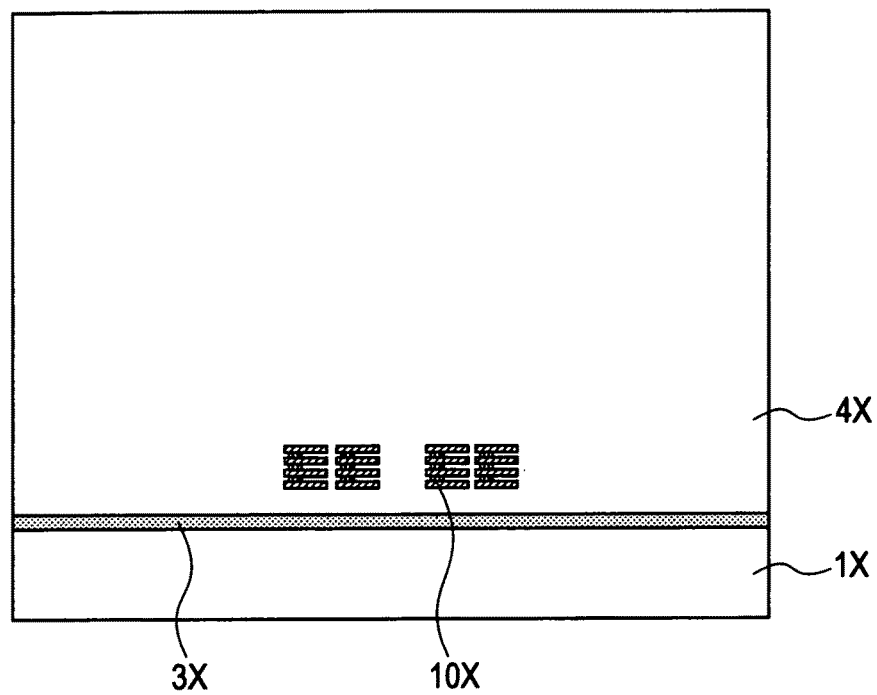
FIG. 10A is a cross sectional view showing one diagrammatic example of the semiconductor device.
Figure 10B:
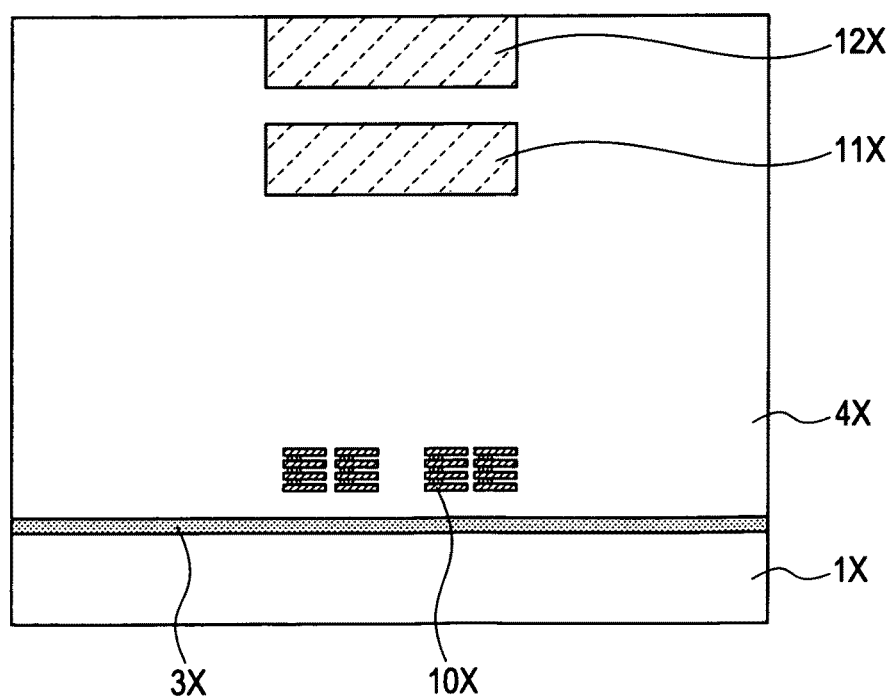
FIG. 10B is a cross sectional view showing one diagrammatic example of the semiconductor device.
Figure 10C:
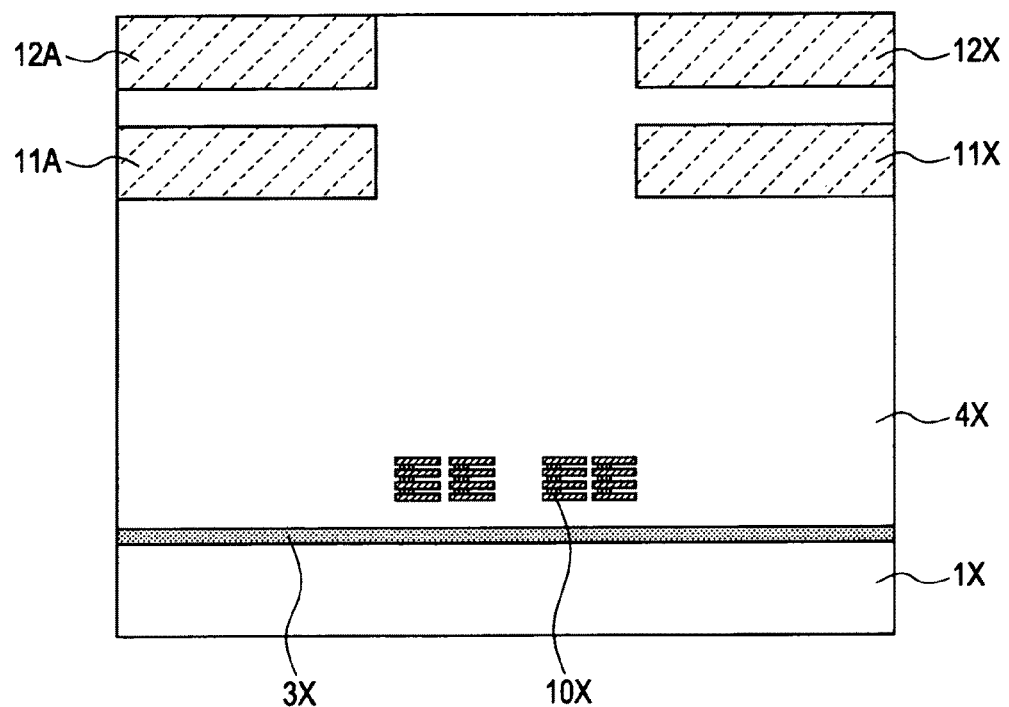
FIG. 10C is a cross sectional view showing one diagrammatic example of the semiconductor device.

FIG. 10A is a drawing showing a structure in which the shielded conductors 13 and 14 and the via holes 15 for coupling the shielded conductor 13 and 14, have been removed from the structure in FIG. 8A, but in all other respects this structure is the same as in FIG. 8A. FIG. 10B is a drawing showing a structure in which the shielded conductors 13 and 14 and the via holes 15 for coupling the shielded conductors 13 and 14, have been removed from the structure in FIG. 8B, but in all other respects this structure is the same as in FIG. 8B. FIG. 10C is a drawing showing a structure in which the shielded conductors 13 and 14 and the via holes 15 for coupling the shielded conductors 13 and 14, have been removed from the structure in FIG. 8C, but in all other respects this structure is the same as in FIG. 8C. The frequency dependence of the inductance was measured in each of these semiconductor device structures.

Figure 11:
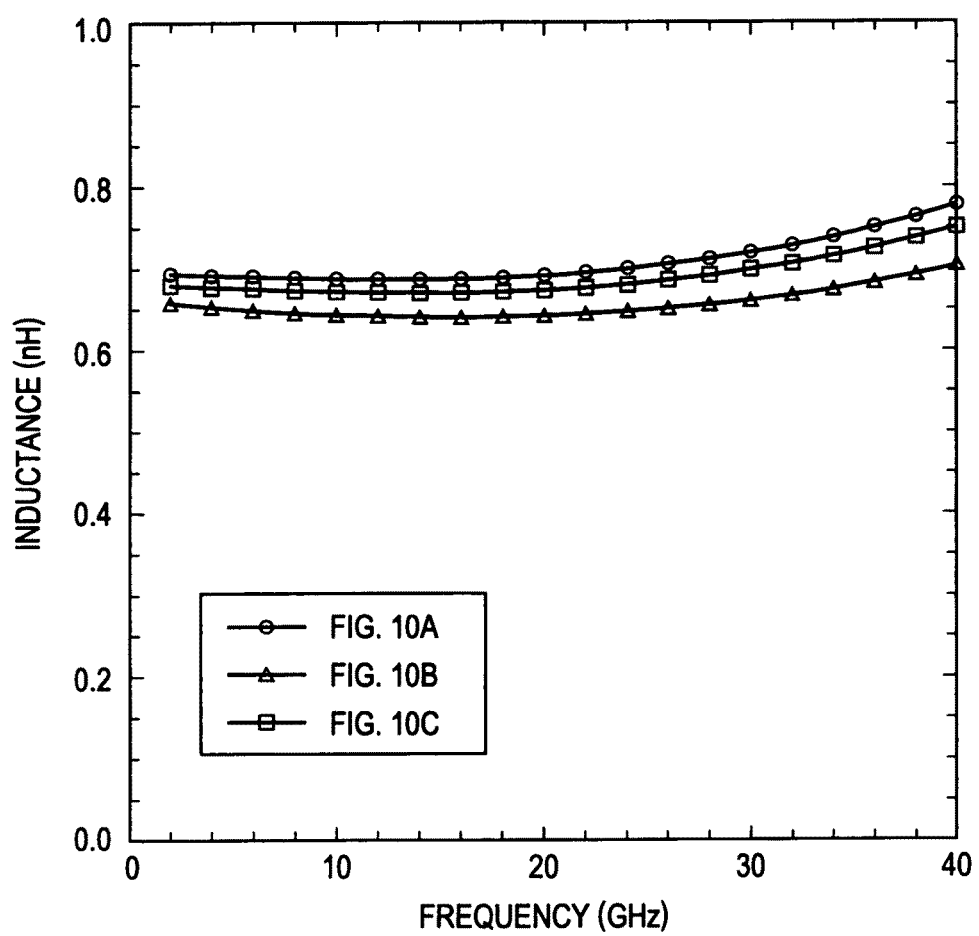
FIG. 11 is a drawing showing the frequency dependence of the structures in FIG. 10A through FIG. 10C on the inductance.

FIG. 11 is a graph showing how the inductance characteristics of the inductor element 10A vary with frequency in each of the structures in FIG. 10A through 10C. As can be seen in FIG. 11, compared to a structure containing no wires 11A and 12A, the inductance value has decreased in the structure containing the wires 11A and 12A. Moreover, the decrease in the inductance value fluctuates with the positions of the wires 11A and 12A that are mounted above the inductor element 10A. More specifically, the structure (FIG. 10B) where the wires 11A and 12A are positioned directly above the inductor element 10A has a larger reduction in induction values than the structure (FIG. 10C) where the wires 11A and 12A are not positioned directly above the inductor element 10A. The percentage of fluctuation in the inductance value of the structure in FIG. 10B is a maximum of approximately −10 percent.

Namely, in a structure as shown in FIG. 10A through 10C where the structure does not contain the shielded conductors of the embodiments, the inductance value can be seen to fluctuate depending on whether or not there are wires 11A and 12A mounted above the inductor element 10A or depending on the placement method.

Figure 20:
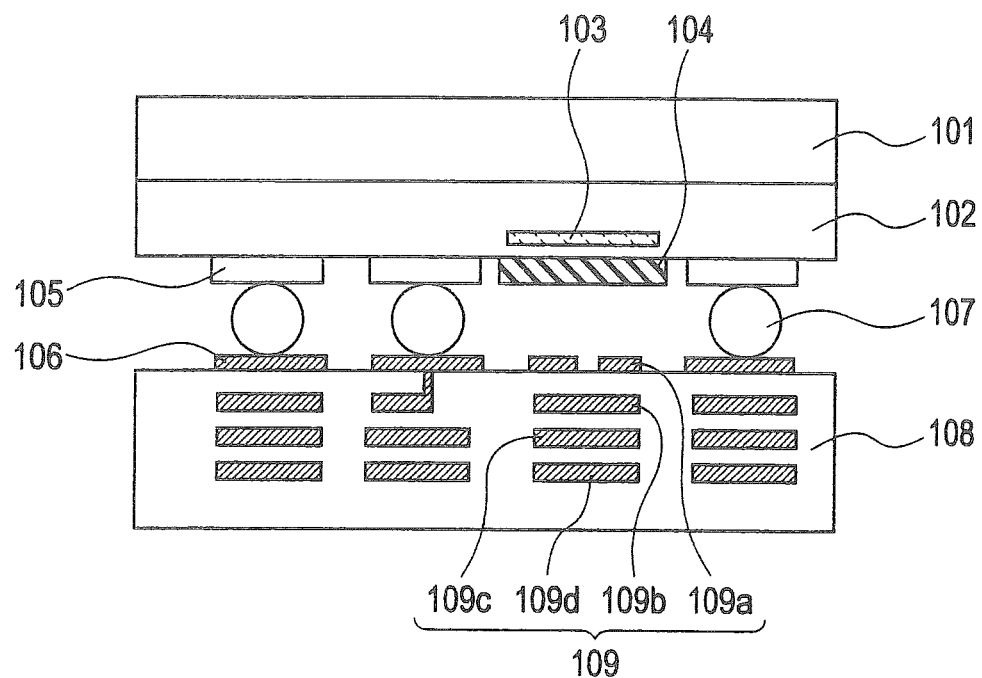
FIG. 20 is a drawing showing the semiconductor device described in Japanese Patent Application Publication No. 2008-218566.

The technology disclosed in Japanese Patent Application Publication No. 2008-218566, forms a shielded conductor 104 not containing an opening such as a slit in the upper section of the inductor element 103 (when set below the semiconductor substrate 101) by using a wiring layer for forming an externally coupled pad over the semiconductor device in order to suppress fluctuations in the inductor element characteristics that occur due to losses in the wire 109 formed over the printed circuit substrate 108 as shown in FIG. 20. However, in this structure, the shielded conductor 104 completely covers the inductor element 103 so that there is a large drop in inductance due to a magnetic energy loss caused by the shielded conductor 104. Obtaining the desired inductance value in this structure therefore requires making the surface area of the inductor element 103 larger. The technology described in Japanese Patent Application Publication No. 2008-218566 makes the distance between the inductor element 103 and the shielded conductor 104 closer (shorter) than the distance between the inductor element 103 and the semiconductor substrate 101 so that a drastic increase in parasitic capacitance occurs in the inductor element 103 due to the shielded conductor 104, and leads to a drop in the self-resonant frequency of the inductor.

Figure 21:
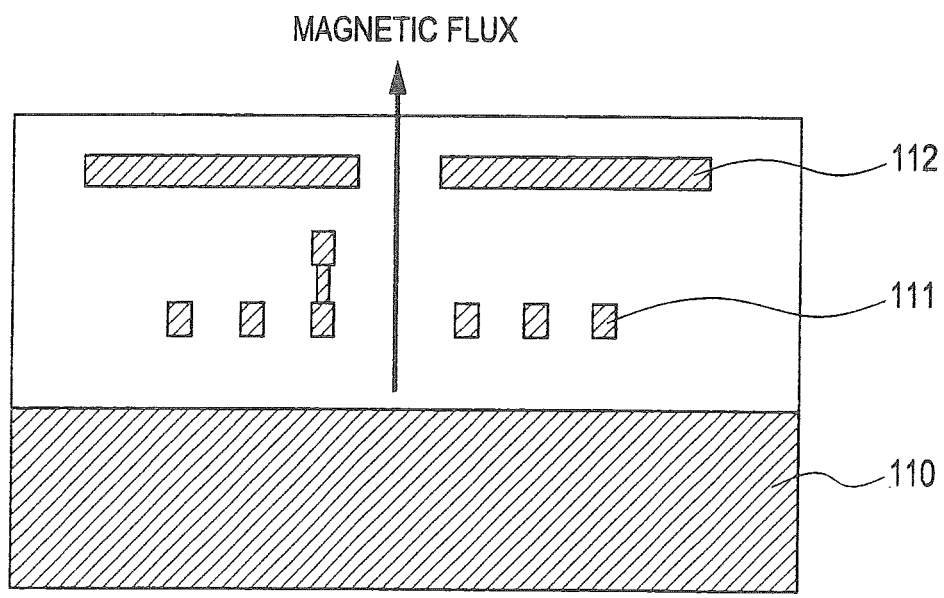
FIG. 21 is a drawing showing the semiconductor device described in Japanese Patent Application Publication No. 2002-198490.

In the technology disclosed in Japanese Patent Application Publication No. 2002-198490 containing an electromagnetic shielded layer 112 in the upper section of the inductor element 111 formed overlying the semiconductor substrate 110 as shown in FIG. 21, a structure is disclosed with an opening formed in the electromagnetic shielded layer 112 for allowing passage of magnetic flux generated in the center of the inductor element 111. However, even though this technology can suppress deterioration in the characteristics of the inductor element due to the magnetic shielded layer 112, the inductor element 111 and the layer above the inductor element 111 are coupled to each other by way of the opening in the electromagnetic shielded layer 112 perpendicular to the semiconductor substrate 110 without the electromagnetic shielded layer 112. Consequently, if there is wiring positioned over the electromagnetic shielded layer 112, then deterioration will occur in the inductor element characteristics due to the mutual interaction occurring between the wiring and the inductor element by way of this opening. Using this structure will therefore cause fluctuations in the inductor element characteristics and lead to circuit malfunctions.

The technology disclosed in International Patent Application No. WO2004/112138 and Japanese Patent Application Publication No. 2008-091631 reduces leakage of magnetic flux in the inductor element to outside the semiconductor device by forming a magnetic layer around the inductor element. However, the electromagnetism when utilizing a ferromagnetic piece causes deterioration of the inductor element characteristics due to eddy-current loss. Moreover, if ferrite material is utilized as the magnetic material then the specific permittivity will be high when the ferrite material is positioned between the inductor element and the wiring at ground voltage potential or power supply voltage potential so that the parasitic capacitance between the inductor and the wiring at the fixed voltage potential will increase, causing the problem of a drop in the self-resonant frequency of the inductor element. The ferromagnetic piece further has hysteresis so that signal distortion occurs within the inductor with the result that the circuit which requires linearity becomes unusable.

Second Embodiment

The second embodiment of the present invention is described next in detail while referring to the drawings.

Figure 12:
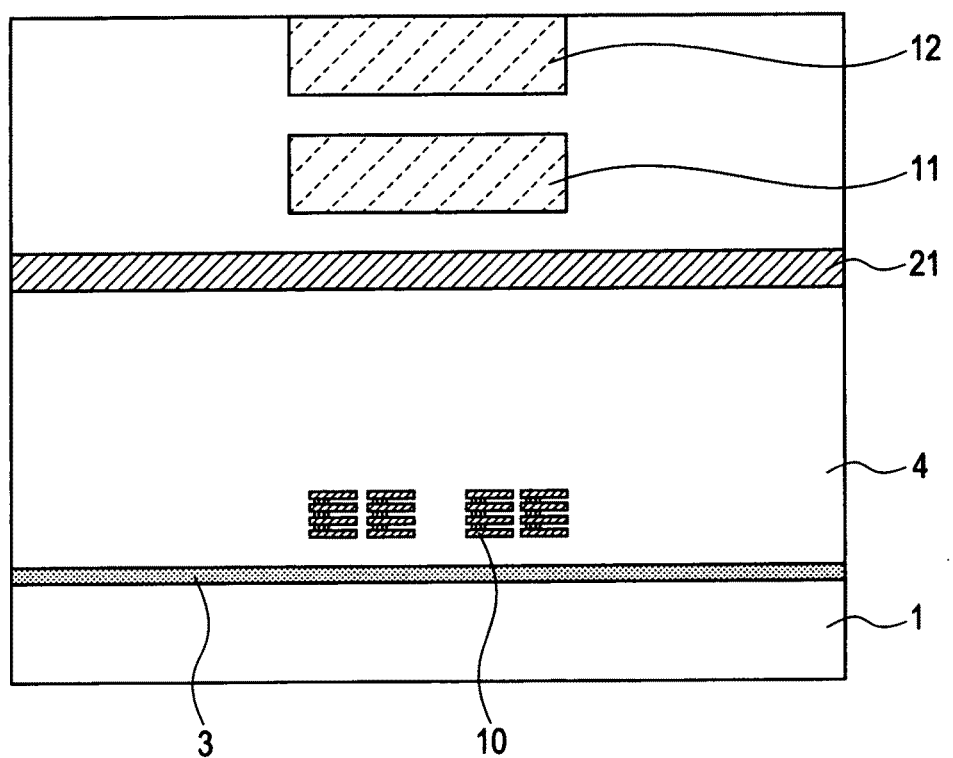
FIG. 12 is a cross sectional view showing one diagrammatic example of the semiconductor device of a second embodiment.

FIG. 12 is a cross sectional view showing one example of this embodiment. The second embodiment is different from the first embodiment in the shielded conductor 21 positioned between the inductor element 10, and the wires 11 and 12 positioned above the inductor element 10 is single layer wiring. However aside from this point, the second embodiment is identical to the first embodiment so a description is omitted here as appropriate for purposes of simplicity.

The shielded conductor 21 is a pattern in which a slit is formed the same as in the shielded conductor 14 in the first embodiment. Multiple wires are formed in the slit, and the wiring may be formed at a right angle to the electrical current flowing in the inductor element 10 directly below the direction the wire extends (See FIG. 3). The shielded conductor 21 may be formed in a matrix pattern to enhance the shielding effect.

Though not shown in the drawing, the present embodiment may contain guard rings (16 shown in FIG. 1) made by utilizing an outer layer of wiring around the inductor element 10 the same as in the first embodiment; and the shielded conductor may also be electrically coupled to the guard rings. The distance between the shielded conductor 21 and the inductor element 10 is also preferably larger than the distance between the inductor element 10 and the semiconductor substrate 1. The effect rendered by this structure is identical to that described for the first embodiment.

This type of embodiment can be applied to cases for example in which the first embodiment cannot accommodate the number of wiring layers comprising the semiconductor device.

The effect of the semiconductor device of this embodiment is described next in detail while referring to the drawings.

In order to clarify the effect of this embodiment, the inventors investigated the fluctuations in inductance in the structure shown in FIG. 12 as one example of the present embodiment; and the structure shown in FIG. 8B as one example of the first embodiment. The shielded conductor 21 shown in FIG. 12 contains the same wiring pattern as the shielded conductor 14 shown in FIG. 4. The wires 11 and 12 are wires at ground voltage potential.

Figure 13:
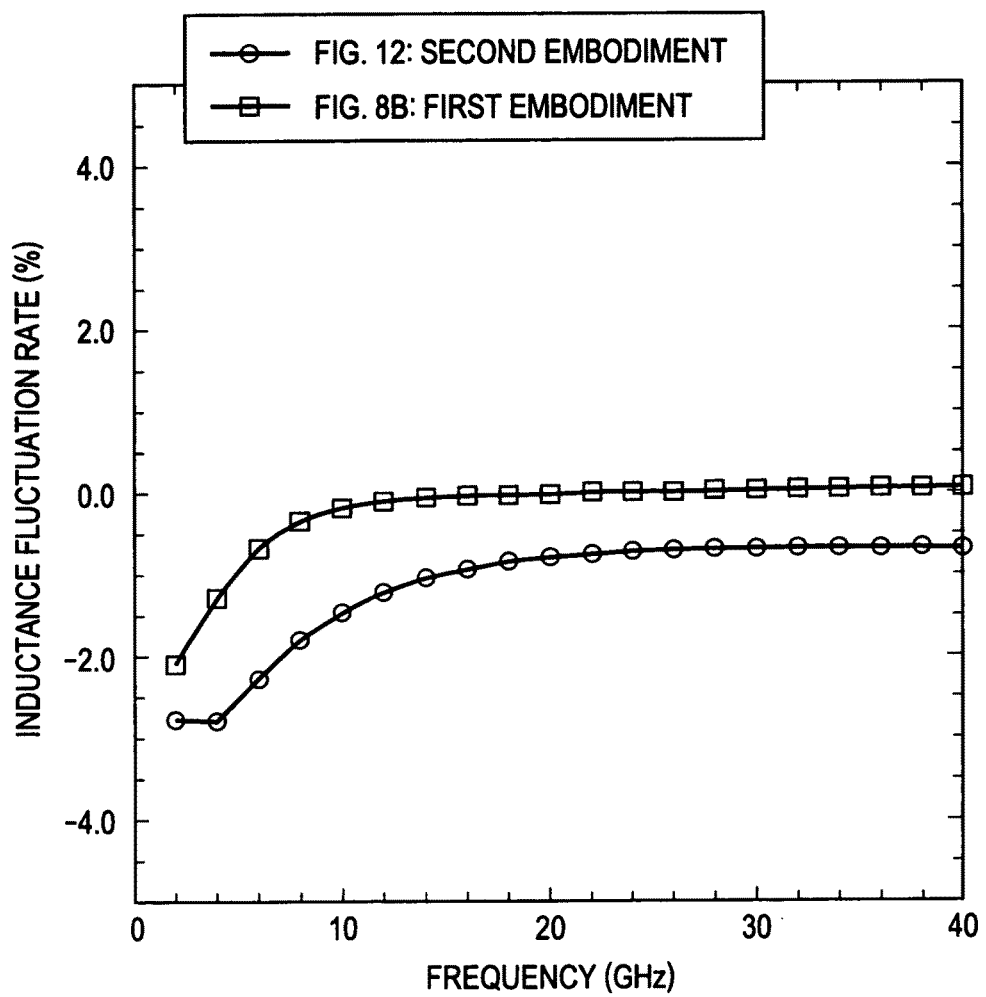
FIG. 13 is a drawing showing the frequency dependence of the structures in FIG. 8B and FIG. 12 on the inductance.

FIG. 13 is a drawing showing how the inductance fluctuation rate in the structure shown in FIG. 8B and the structure shown in FIG. 12 varies with frequency. Examining FIG. 13 shows that compared to the structure in FIG. 8B, the structure shown in FIG. 12 has a larger (rate of decrease) in inductance fluctuation rate across the entire frequency band, and that the shielded conductor has little shielding effect. Though not shown in the drawing, the inductance fluctuation rate was sufficiently small compared to the comparative examples (FIG. 10A through FIG. 10C) described for the first embodiment.

Namely, though the effect is diminished compared to the first embodiment, the present embodiment can render the same effect as the first embodiment even when the shielded conductor is formed above the inductor element 10 as a shielded conductor formed from single-layer wiring.

Third Embodiment

The third embodiment of the present invention is described next in detail while referring to the drawings.

Figure 14:
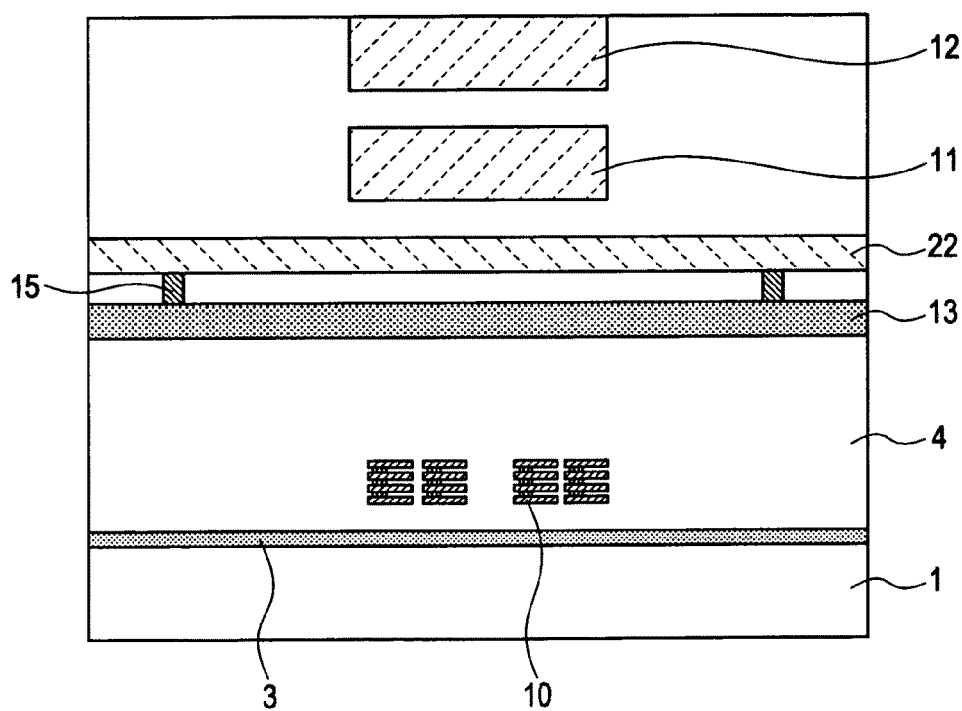
FIG. 14 is a cross sectional view showing one diagrammatic example of the semiconductor device of a third embodiment.
Figure 15:
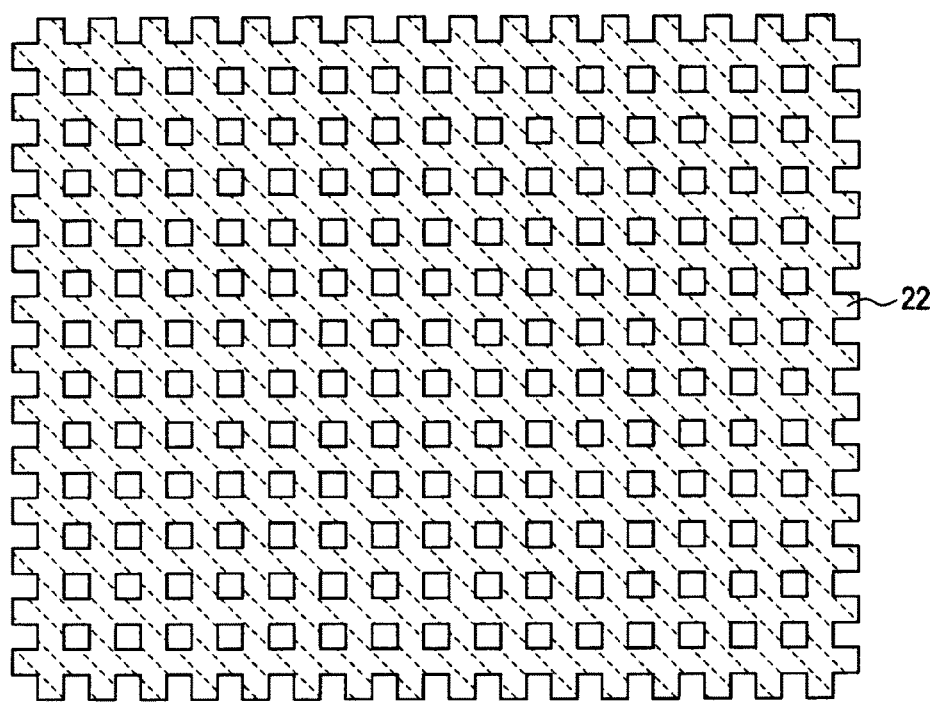
FIG. 15 is an upper view showing one diagrammatic example of the shielded conductor of the present embodiment.

FIG. 14 is a cross sectional view showing one example of the embodiment. Among the shielded conductors formed from two-layer wiring in the example shown in FIG. 14, the shielded conductor 13 positioned in the lower layer is a shielded conductor formed as shown in FIG. 3 the same as in the first embodiment; and the shielded conductor 22 positioned in the upper layer is a shielded conductor containing a matrix pattern as shown in FIG. 15. Namely, unlike the first embodiment, the present embodiment contains at least one each of a "shielded conductor containing a matrix pattern" and a "shielded conductor" that includes shielded conductor wires electrically coupled to each other, and the direction that the wiring positioned in the area overlapping the inductor element 10 extends as seen from a flat view is approximately perpendicular to the flow of electrical current in the inductor element 10 immediately below that wiring (hereafter, "shielded conductor containing slits"). The upper and lower positional relations of these two shielded conductors are not limited to the relation shown in FIG. 14. However in order to suppress a drop in inductance due to magnetic energy loss within the shielded conductor, the shielded conductor containing a matrix pattern is preferably placed at the upper position as shown in FIG. 14. In view of the above points, if there are multiple shielded conductors then in this structure, the shielded conductor containing slits is preferably positioned in the lowermost layer, and the shielded conductor containing the matrix pattern is preferably placed above as high as possible.

Though not shown in the drawing, the embodiment may also include guard rings (reference numeral 16 shown in FIG. 1) formed from multi-layer wiring around the inductor element the same as in the first embodiment. The shielded conductor 22 and the guard rings may also be electrically coupled together. The effect of the invention obtained in this type of structure is the same as described for the first embodiment.

Figure 16:
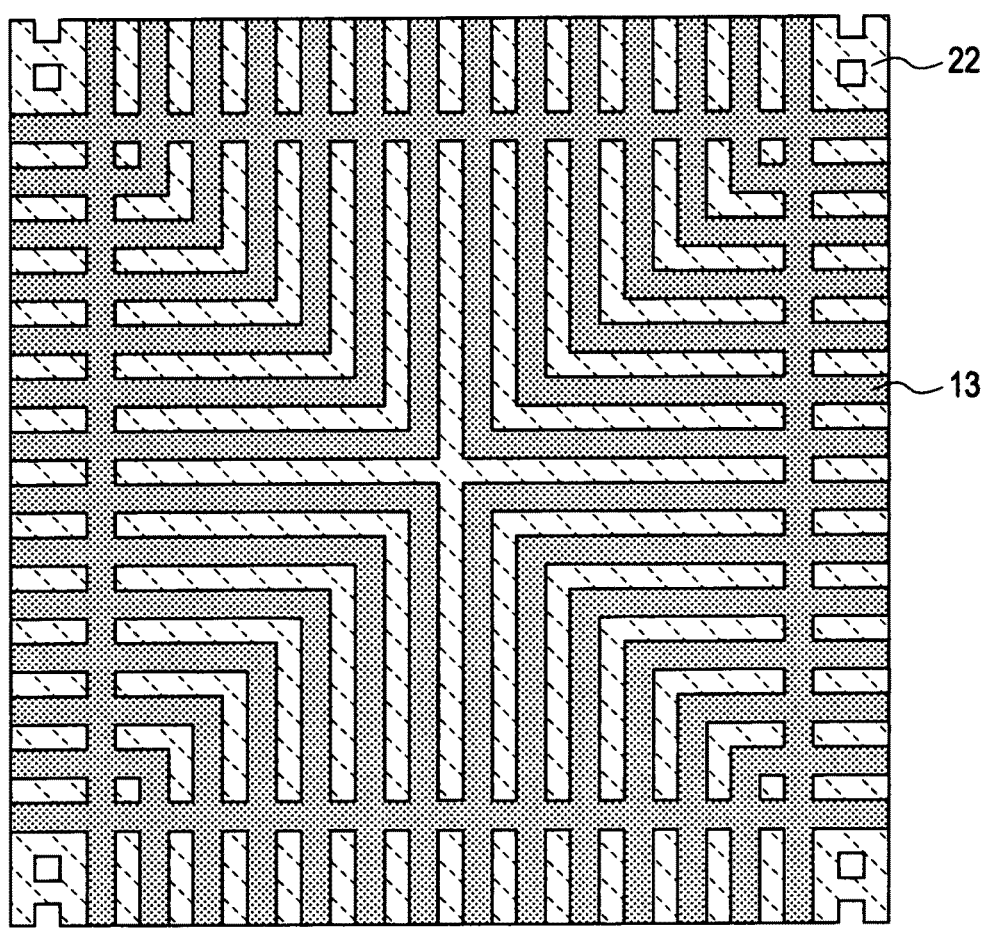
FIG. 16 is an upper view showing one diagrammatic example of the shielded conductor of the present embodiment.

Here, FIG. 16 shows an upper view of the state where a shielded conductor 13 with a structure as shown in FIG. 3 and a shielded conductor 22 with a structure as shown in FIG. 15 are stacked so as to overlap as seen from a flat view. One example given in an upper view (FIG. 14) shows a shielded conductor 13 with a structure as shown in FIG. 3, in a state where stacked so as to overlap a shielded conductor 22 such as shown in FIG. 15 as seen from a flat view.

As shown in FIG. 16, in this embodiment the conductive sections of the shielded conductor 22 containing a matrix pattern are designed so as to overlap the slit sections of the shielded conductor 13 containing slits as seen from a flat view. In addition to the above, the wiring section of the shielded conductor 13 with slit patterns is designed so as to overlap the open section of the shielded conductor 22 containing a matrix pattern as seen from a flat view. The multiple shielded conductors of this embodiment obtained by stacking the multiple shielded conductors so as to overlap as seen from a flat view are therefore a structure having no gaps as seen from a flat view. Employing this structure sufficiently shields the inductor element 10 from the wires 11 and 12. In order to achieve this structure the width of the slits on the shielded conductor that contains slits is preferably made the same or smaller than the width of the conductive sections of shielded conductor containing a matrix pattern. Moreover, the width of the open section of the shielded conductor containing a matrix pattern is preferably the same or smaller than the width of the wiring on the shielded conductor that contains slits. If there are multiple shielded conductors then the open sections of all the shielded conductors (e.g. shielded conductor 22) containing matrix patterns are configured so as to overlap the conductive section of at least one of the other shielded conductors as seen from a flat view. Moreover, the slit sections of all the shielded conductors (e.g. shielded conductor 13) containing slits are configured so as to overlap a conductive section of at least one other shielded conductor.

The present embodiment is capable of a more potent shielding effect by the shielded conductor than the first and the second embodiments. On the other hand, installing a matrix-shaped shielded conductor causes a large drop in inductance due to a loss of magnetic energy within the shielded conductor so that the inductor element must be made to larger dimensions than in the first embodiment in order to obtain the desired inductance value.

Namely, the designers of the semiconductor device took into account the desired shielding effect and the area occupied by the inductor element in the design, so that the first embodiment or the present embodiment can be selected.

Fourth Embodiment

The fourth embodiment of the present invention is described next in detail while referring to the drawings.

Figure 17:
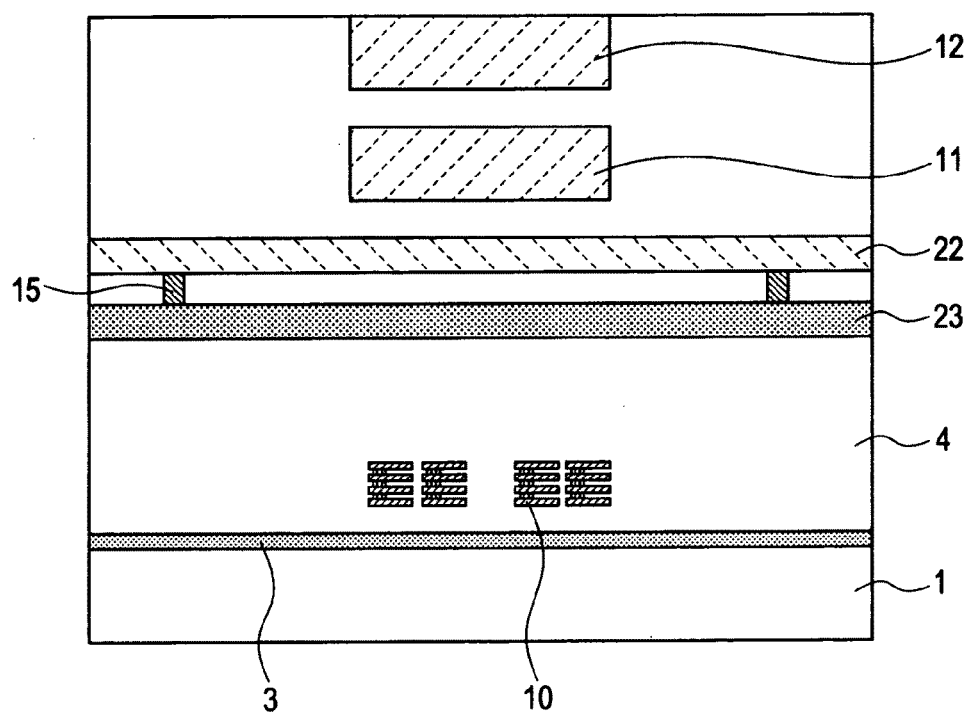
FIG. 17 is a cross sectional view showing one diagrammatic example of the semiconductor device of a fourth embodiment.

FIG. 17 is a cross sectional drawing showing one example of the embodiment. This embodiment differs from the first embodiment in the unique feature that both the shielded conductors 22 and 23 of two layers or more positioned between the inductor element 10 and wires 11 and 12 placed above the inductor element 10 contain a matrix pattern. The present embodiment is identical to the first embodiment in other than the above differing point so a description is omitted for purposes of convenience.

Though not shown in the drawing, the present embodiment may also include guard rings (reference numeral 16 shown in FIG. 1) formed from multi-layer wiring around the inductor element 10 the same as in the first embodiment. The shielded conductor 22 and the guard rings may also be electrically coupled together. The effect of the invention obtained in this type of structure is the same as described for the first embodiment.

Figure 18:
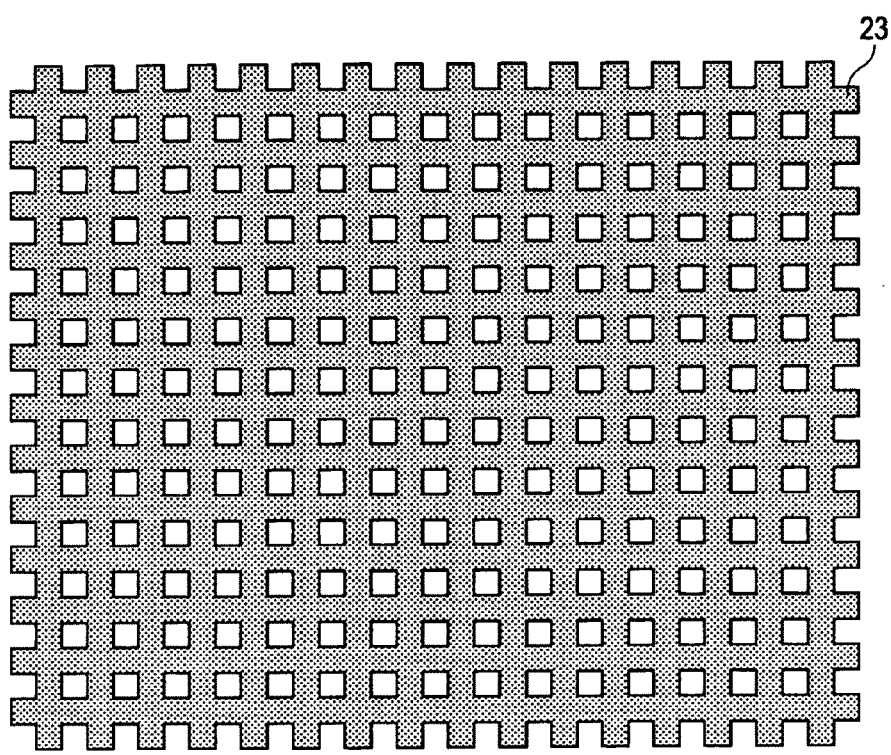
FIG. 18 is an upper view showing a diagrammatic example of the shielded conductor of the present embodiment.
Figure 19:
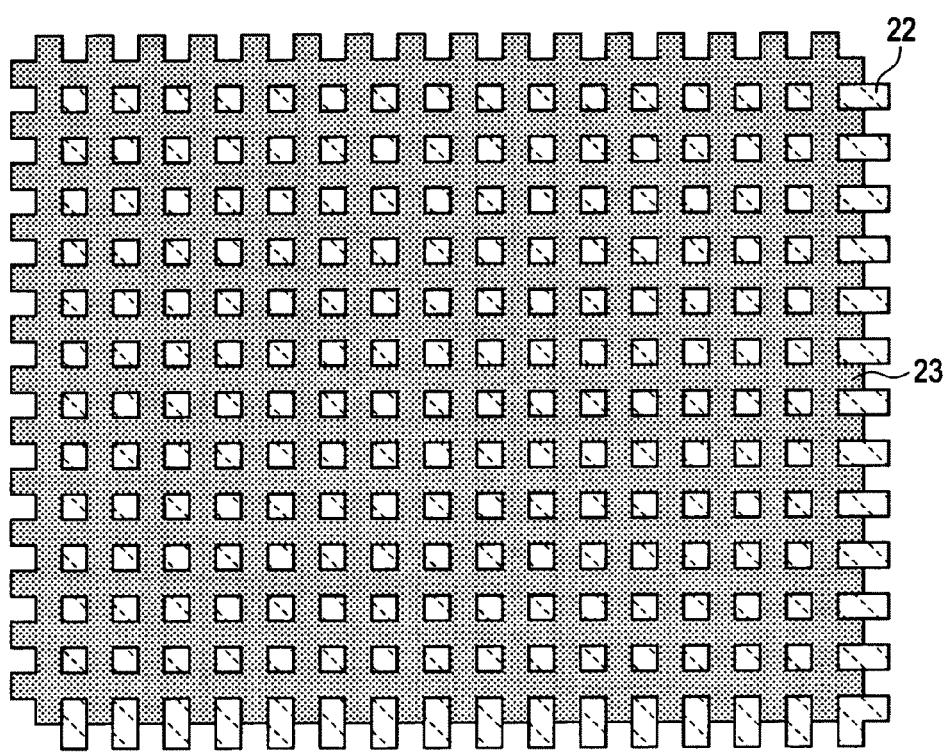
FIG. 19 is an upper view showing a diagrammatic example of the shielded conductor of the present embodiment.

Here, FIG. 19 shows an upper view of the state in which a shielded conductor 22 with a structure as shown in FIG. 15, and a shielded conductor 23 such as shown in FIG. 18 are stacked so as to overlap as seen from a flat view (FIG. 17) as an example of the embodiment in which two shielded conductors containing a matrix pattern are stacked so as to overlap as seen from a flat view.

In this embodiment as shown in FIG. 19, the conductive sections of the shielded conductor 23 are designed so as to overlap the open sections of the shielded conductor 22 as seen from a flat view. In addition to the above, the conductive section of the shielded conductor 22 is designed so as to overlap the open section of the shielded conductor 23 as seen from a flat view. The shielded conductors of this embodiment obtained by overlapping the shielded conductor 22 and the shielded conductor 23 as seen from a flat view are therefore a structure having no gaps. Employing this structure sufficiently shields the inductor element 10 from the wires 11 and 12. In order to achieve this structure the width of the open section of the shielded conductor 12 is preferably the same width or less than the conductive section of the shielded conductor 23. Moreover, the width of the open section of the shielded conductor 23 is preferably the same or smaller than the width of the conductive section on the shielded conductor 22. If there are multiple shielded conductors then at least another of the conductive sections of another shielded conductor is configured to overlap the open sections of all the shielded conductors as seen from a flat view.

The present embodiment is capable of a more potent shielding effect by the shielded conductor than the first, second and third embodiments. However installing multiple matrix pattern shielded conductors in the present embodiment causes large losses in the shielded conductor so that obtaining the desired inductance value requires forming the inductor element to larger in dimension.

Namely, the designers of the semiconductor device took into account the desired shielding effect and the area occupied by the inductor element in the design, so that one semiconductor device can be selected from among the first embodiment, the second embodiment, or the present embodiment.

Applications of the present invention are utilizable in semiconductor devices containing transistors and multi-layer wiring. Semiconductor devices are also likely to be utilized at higher operating frequencies as semiconductor device performance improves. Moreover, greater future expansion is expected in applications in the high-frequency band utilized for wireless communications and in high-speed logic circuits. The present invention places a shielded conductor over the inductor and in this way allows the designer greater freedom in laying out wires at a fixed voltage potential over the shielded conductor, in semiconductor devices that must operate at high frequencies particularly among semiconductor devices containing inductor elements. The present invention can in this way reduce the number of man-hours required to design the semiconductor device, and can moreover reduce the surface area taken up on the chip surface and provide a semiconductor device with high reliability, and high performance at a low cost.

What is claimed is:

1. A semiconductor device comprising:
   a semiconductor substrate;
   an inductor element;
   a plurality of wires formed above the inductor element; and
   a shield conductor at a fixed voltage potential formed between the inductor element and the plurality of wires in order to cover the inductor element as seen from a plane view, the shield conductor comprising a plurality of shield conductors including a first shield conductor and a second shield conductor formed above the first shield conductor and electrically connected to the first shield conductor,
   wherein the first shield conductor comprises a plurality of slits and the second shield conductor comprises a plurality of shield conductor wires which overlap the plurality of slits.

2. The semiconductor device according to claim 1, wherein the fixed voltage potential of the shield conductor is any one of a power supply voltage potential supplied to the semiconductor device, or a ground voltage potential, or a voltage approximately half the power supply voltage potential.

3. The semiconductor device according to claim 1, wherein a film thickness of the plurality of wires is the same or thicker than a film thickness of the shield conductor, and is the same or thicker than a film thickness of the inductor element.

4. The semiconductor device according to claim 1, wherein a film thickness of the shield conductor is the same or thicker than a film thickness of the inductor element.

5. The semiconductor device according to claim 1, wherein the shield conductor comprises a matrix pattern in an area overlapping the inductor element as seen from a plane view.

6. The semiconductor device according to claim 1, wherein the shield conductor comprises shield conductor wires that are electrically coupled to each other, and
   wherein a direction that the shield conductor wires positioned in an area overlapping the inductor element extends as seen from a plane view, is a direction at an approximate right angle relative to a direction of electrical current flow in the inductor element directly below the shield conductor wires.

7. The semiconductor device according to claim 1, wherein the plurality of wires all extend in the same direction,
   wherein the inductor element includes a plurality of inductor wires that are electrically coupled to each other, and
   wherein the plurality of inductor wires comprises:
      a first inductor wire extending approximately in parallel to the direction that the plurality of wires extend; and
      a second inductor wire extending approximately at a right angle to the direction that the plurality of wires extend.

8. The semiconductor device according to claim 1, wherein a perpendicular distance between the inductor element and the shield conductor relative to the semiconductor substrate is greater than a perpendicular distance between the inductor element and the semiconductor substrate relative to the semiconductor substrate.

9. The semiconductor device according to claim 1, wherein the plurality of wires are at a fixed voltage potential, and
   wherein the fixed voltage potential of the plurality of wires is any one among a power supply voltage potential supplied to the semiconductor device, or a ground voltage potential, or a voltage potential approximately half the power supply voltage potential.

10. The semiconductor device according to claim 1, wherein the plurality of wires comprises a signal line at a variable voltage potential.

11. The semiconductor device according to claim 1, further comprising:
    a spiral wire to enclose the inductor element in a loop shape,
    wherein the shield conductor is electrically coupled to the spiral wire.

12. The semiconductor device according to claim 1, further comprising:
    a circuit including the inductor element, the shield conductor, and the plurality of wires.

13. The semiconductor device according to claim 1, wherein the plurality of slits of the first shield conductor are formed at a right angle relative to an electrical current flow direction of the inductor element, such that a plurality of shield conductor wires are formed between the plurality of slits, and
    wherein the second shield conductor comprises a plurality of slits which are formed at a right angle relative to an electrical current flow direction of the inductor element, the plurality of slits of the second shield conductor being formed between the plurality of shield conductor wires of the second shield conductor.

14. The semiconductor device according to claim 5, wherein the plurality of shield conductors are respectively formed in the area overlapping the inductor element in different layers as seen from a plane view and electrically coupled to each other by via holes.

15. The semiconductor device according to claim 7, wherein a length of the first inductor wire is shorter than a length of the second inductor wire.

16. The semiconductor device according to claim 9, wherein the plurality of wires comprises:
    first wires with a fixed voltage potential at the power supply voltage potential supplied to the semiconductor device; and
    second wires with a fixed voltage potential at ground voltage potential which are alternately arrayed within the same layer with the first wires.

17. The semiconductor device according to claim 14, wherein a film thickness of the plurality of shield conductors adjacent in an upward/downward direction is the same, or a film thickness of the shield conductor in an upper position is thicker.

18. The semiconductor device according to claim 14, wherein the plurality of shield conductors comprises a pattern including an open area and a conductive area, and wherein the open area of a shield conductor of the plurality of shield conductors overlaps a conductive area of at least one other shield conductor of the plurality of shield conductors.

19. The semiconductor device according to claim 14, wherein the plurality of shield conductors comprises shield conductor wires electrically coupled to each other, and wherein a direction that the shield conductor wires positioned in an area overlapping the inductor element extend as seen from a plane view, is a direction at an approximate right angle relative to a direction of electrical current flow in the inductor element directly below the shield conductor wires in the plurality of shield conductors.

20. The semiconductor device according to claim 14, wherein the plurality of shield conductors comprises shield conductor wires electrically coupled to each other, and forming a matrix pattern, wherein a direction that the shield conductor wires positioned in an area overlapping the inductor element extend as seen from a plane view, is a direction at an approximate right angle relative to a direction of electrical current flow in the inductor element directly below the shield conductor wires in the plurality of shield conductors.

21. The semiconductor device according to claim 14, wherein the plurality of shield conductors comprises a matrix pattern.

22. The semiconductor device according to claim 14, wherein a perpendicular distance between the inductor element and the shield conductor positioned at the lowermost layer relative to the semiconductor substrate is greater than a perpendicular distance between the inductor element and the semiconductor substrate relative to the semiconductor substrate.

23. A shield conductor arrangement for a semiconductor device including an inductor element and a guard ring formed around at least a portion of the inductor element, the shield conductor arrangement comprising:

a plurality of shield conductors at a fixed voltage potential which are electrically connected to the guard ring, the plurality of shield conductors comprising:

a first shield conductor comprising a plurality of first slits which include a right angle relative to an electrical current flow direction of the inductor element, such that a plurality of shield conductor wires are formed between the plurality of slits; and a second shield conductor formed above the first shield conductor and electrically connected to the first shield conductor, and including a plurality of second slits which include a right angle relative to an electrical current flow direction of the inductor element, such that the plurality of second slits overlap the plurality of shield conductor wires of the first shield conductor.

* * * * *